United States Patent
Spinner et al.

(10) Patent No.: US 10,598,722 B1
(45) Date of Patent: Mar. 24, 2020

(54) AUTOMATED WAVEFORM ANALYSIS METHODS USING A PARALLEL AUTOMATED DEVELOPMENT SYSTEM

(71) Applicant: Advanced Testing Technologies, Inc., Hauppauge, NY (US)

(72) Inventors: Robert Spinner, East Northport, NY (US); Eli Levi, Dix Hills, NY (US); Jim McKenna, Bohemia, NY (US); William Harold Leippe, Coram, NY (US); William Biagiotti, St. James, NY (US); Richard Engel, Ridge, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 229 days.

(21) Appl. No.: 15/784,257

(22) Filed: Oct. 16, 2017

Related U.S. Application Data

(60) Continuation-in-part of application No. 15/619,752, filed on Jun. 12, 2017, now Pat. No. 9,864,003, which is a division of application No. 15/422,610, filed on Feb. 2, 2017, now Pat. No. 9,739,827.

(60) Provisional application No. 62/438,767, filed on Dec. 23, 2016.

(51) Int. Cl.
  *G01R 31/28* (2006.01)
  *G01R 31/3183* (2006.01)
  *G01R 1/04* (2006.01)

(52) U.S. Cl.
  CPC ....... *G01R 31/2834* (2013.01); *G01R 1/0416* (2013.01); *G01R 31/2851* (2013.01); *G01R 31/31835* (2013.01); *G01R 31/318342* (2013.01); *G01R 31/318357* (2013.01)

(58) Field of Classification Search
  CPC ............ G01R 31/2834; G01R 31/2851; G01R 1/0416; G01R 31/31835; G01R 31/318357; G01R 31/318342
  USPC .................................................... 324/750.01
  See application file for complete search history.

(56) References Cited

U.S. PATENT DOCUMENTS

| | | | | |
|---|---|---|---|---|
| T920,014 I4 | * | 3/1974 | Kraus | G06F 17/5009 714/741 |
| 4,316,259 A | * | 2/1982 | Albrecht | G06F 1/022 708/270 |
| 4,512,179 A | * | 4/1985 | Umble | G01L 27/005 73/1.61 |
| 4,789,835 A | | 12/1988 | Herlein | |

(Continued)

*Primary Examiner* — Christopher P McAndrew
(74) *Attorney, Agent, or Firm* — Brian Roffe

(57) ABSTRACT

A mixed signal testing system capable of testing differently configured units under test (UUT) includes a controller, a test station and an interface system that support multiple UUTs. The test station includes independent sets of channels configured to send signals to and receive signals from each UUT being tested and signal processing subsystems that direct stimulus signals to a respective set of channels and receive signals in response thereto. The signal processing subsystems enable simultaneous and independent directing of stimulus signals through the sets of channels to each UUT and reception of signals from each UUT in response to the stimulus signals. Received signals responsive to stimulus signals provided to a fully functional UUT (with and without induced faults) are used to assess presence or absence of faults in the UUT being tested which may be determined to include one or more faults or be fault-free, i.e., fully functional.

24 Claims, 8 Drawing Sheets

(56) References Cited

U.S. PATENT DOCUMENTS

| | | | |
|---|---|---|---|
| 4,894,829 A * | 1/1990 | Monie | G01R 31/318307 702/123 |
| 6,268,735 B1 | 7/2001 | Craig et al. | |
| 6,365,681 B1 | 4/2002 | Bella | |
| 6,365,861 B1 * | 4/2002 | Beffa | B07C 5/3412 209/571 |
| 6,366,109 B1 | 4/2002 | Matsushita | G01R 31/31926 324/750.01 |
| 6,479,985 B2 * | 11/2002 | Lambert | G01R 31/319 324/73.1 |
| 6,512,989 B1 | 1/2003 | Duome et al. | |
| 6,871,298 B1 * | 3/2005 | Cavanaugh | G06F 11/263 712/227 |
| 6,956,377 B2 | 10/2005 | Masaoka | |
| 7,010,453 B2 | 3/2006 | Hildebrant | |
| 7,039,545 B2 | 5/2006 | Bundy et al. | |
| 7,139,949 B1 * | 11/2006 | Jennion | G06F 11/2236 714/726 |
| 7,609,081 B2 | 10/2009 | Wong et al. | |
| 7,680,615 B2 * | 3/2010 | Huang | G01R 31/2834 702/85 |
| 7,769,558 B2 | 8/2010 | Kappauf et al. | |
| 7,971,176 B2 * | 6/2011 | Desineni | G01R 31/31835 702/120 |
| 8,359,504 B1 | 1/2013 | Pogosky et al. | |
| 8,359,585 B1 | 1/2013 | Spinner et al. | |
| 8,423,315 B2 | 4/2013 | Kappauf et al. | |
| 8,473,792 B2 * | 6/2013 | Chakravarty | G01R 31/318544 714/726 |
| 8,655,617 B1 * | 2/2014 | Biagiotti | H04N 17/004 382/140 |
| 8,788,228 B1 * | 7/2014 | Biagiotti | H04N 17/004 702/66 |
| 8,797,046 B2 | 8/2014 | Rivoir et al. | |
| 9,164,859 B2 | 10/2015 | Rivera Trevino et al. | |
| 9,291,677 B1 | 3/2016 | Korpi et al. | |
| 9,294,296 B2 | 3/2016 | Kirschnick et al. | |
| 9,384,018 B2 | 7/2016 | Du | |
| 9,419,558 B2 * | 8/2016 | Krasowski | H02S 50/10 |
| 9,423,468 B2 * | 8/2016 | Jeong | G01R 31/40 |
| 9,429,623 B2 | 8/2016 | Filler et al. | |
| 9,558,014 B2 | 1/2017 | Ligman et al. | |
| 9,739,827 B1 * | 8/2017 | Spinner | G01R 31/2834 |
| 2003/0015699 A1 * | 1/2003 | Su | G03F 7/70558 257/48 |
| 2003/0061491 A1 | 1/2003 | Su | |
| 2004/0054492 A1 | 3/2004 | Hagerott et al. | |
| 2004/0061491 A1 * | 4/2004 | Chung | G01R 31/2851 324/757.01 |
| 2006/0253751 A1 * | 11/2006 | Gunda | G01R 31/318328 714/724 |
| 2007/0050166 A1 * | 3/2007 | Spinner | G01R 31/2848 702/108 |
| 2008/0010524 A1 | 1/2008 | Higashi et al. | |
| 2008/0012666 A1 * | 1/2008 | Davison | H02H 1/046 335/18 |
| 2008/0048677 A1 * | 2/2008 | Tan | G01R 35/005 324/638 |
| 2008/0115028 A1 * | 5/2008 | Homer | G01R 31/31704 714/741 |
| 2009/0043528 A1 | 2/2009 | Asami | |
| 2009/0058454 A1 | 3/2009 | An et al. | |
| 2009/0192750 A1 * | 7/2009 | Huang | G01R 31/2834 702/104 |
| 2010/0287604 A1 * | 11/2010 | Potkonjak | G06F 21/73 726/6 |
| 2012/0121000 A1 * | 5/2012 | Olgaard | H04L 1/06 375/224 |
| 2012/0242357 A1 * | 9/2012 | Eccles | G01R 31/3191 324/750.01 |
| 2013/0027256 A1 * | 1/2013 | Guo | H04L 41/0823 343/703 |
| 2013/0162273 A1 * | 6/2013 | Chin | G01R 31/31721 324/750.01 |
| 2013/0221999 A1 * | 8/2013 | Tian | G06F 11/2284 324/750.01 |
| 2013/0227509 A1 * | 8/2013 | Chang | G06F 17/5081 716/111 |
| 2015/0285855 A1 * | 10/2015 | Kao | G01R 31/2834 702/123 |
| 2015/0309123 A1 * | 10/2015 | Berroteran Gil | G01R 31/40 324/764.01 |
| 2016/0112148 A1 * | 4/2016 | Liu | H04B 17/29 455/67.14 |
| 2018/0309506 A1 * | 10/2018 | Reid | H04B 7/18519 |

* cited by examiner

AUTOMATED WAVEFORM ANALYSIS METHODS USING A PARALLEL AUTOMATED DEVELOPMENT SYSTEM

CROSS-REFERENCE TO RELATED APPLICATIONS

This application claims priority of U.S. provisional patent application Ser. No. 62/438,767 filed Dec. 23, 2016, and is a continuation-in-part of U.S. patent application Ser. No. 15/619,752 filed Jun. 12, 2017, now U.S. Pat. No. 9,864,003, which is a divisional of U.S. patent application Ser. No. 15/422,610 filed Feb. 2, 2017, now U.S. Pat. No. 9,739,827, which claims priority of U.S. provisional patent application Ser. No. 62/438,767 filed Dec. 23, 2016, all of which are incorporated by reference herein.

FIELD OF THE INVENTION

The present invention relates generally to providing automated test equipment (ATE) and more specifically automated test systems (ATS). The invention takes a novel approach by employing mixed signal parallel functional testing in lieu of a traditional top-down parametric based approach by tightly integrating the hardware instrumentation with the software toolset suite. This test philosophy involves parallel data processing using, but not limited to, high speed analog-to-digital conversion (ADC) capture channels mated with automated waveform analysis algorithms that permit deployment of a test program set (TPS) in a fraction of the time a traditional top down serial TPS would take.

BACKGROUND OF THE INVENTION

Automated test systems (ATS) are generally used for testing electronic assemblies. These electronic assemblies may take the form of a line replaceable unit (LRU) or shop replaceable unit (SRU). Typically, LRUs are higher level assemblies that contain a plurality of smaller SRUs. These test systems (also referred to as testers or test stations) are populated with various pieces of automatic test equipment (ATE) in the form of stand-alone (aka 'rack and stack') or modular (i.e., VXI, PXI, etc.) instrumentation. These test systems may be specialized (able to test one specific assembly or family of assemblies for a specific electronics platform) or general purpose (able to test a broad range of electronics) in nature.

The software that runs the ATS is typically referred to as a runtime system and test executive which provides a testing hierarchy in the form of a testplan, entry point(s) and teststeps. A test program set (TPS) implements the entry point(s) and teststeps and typically targets a specific assembly (also referred to as a unit under test or UUT). Each teststep typically executes and evaluates a single performance test. An entry point is a group of teststeps that share a common function such as transmit, receive, etc. The testplan specifies the entry points that are executed on the assembly. The test executive allows teststeps and/or entry points to be bypassed or looped, and handles the overall operation/flow of the TPS. Coding of a TPS can take months or even years to write and integrate depending on the complexity of the UUT.

Current test stations typically include a significant arsenal of instrumentation and specialized equipment connected through a mass terminated patch panel that can connect/disconnect a 1000 or more signals at once. While this approach permits coverage across a broad range of electronics assemblies, it does have drawbacks. Most test stations implement some form of mechanical switching to route signals to/from the equipment. As test stations age, these switching elements tend to degrade, resulting in operational intermittency, higher insertion loss and lower isolation which can affect test measurements. A mass terminated patch panel is rather large and expensive, and not suited for testing the input/output (I/O) count of smaller assemblies.

A smaller, more nimble tester is more appropriate for these types of assemblies. High speed analog-to-digital conversion (ADC) technologies have advanced to the point where parallel signal capture at sufficient bandwidth, resolution and density can reliably support test program set (TPS) development using a parallel digitizing approach. Simultaneous asset use using a parallel test approach allows testing of multiple signal nodes at once resulting in a substantial reduction in test program set (TPS) runtime when compared against the traditional serial functional test approach.

A TPS is typically developed using OEM data such as acceptance test procedure (ATP), theory of operation, manuals, schematics or other relevant data. Often electronics assemblies remain in service long beyond their design life. In instances where this is the case, the original support equipment may be nearing (or even beyond) the end of its planned lifecycle, unable to test these legacy assemblies. In other instances, the ability to test these assemblies may no longer exist, resulting in an 'orphan' assembly. This can be further compounded by the lack of original equipment manufacturer (OEM) data or even cases where the OEM is now a defunct entity. The absence of UUT data can substantially increase the TPS effort and in some cases prevent implementation of a TPS altogether. In these situations, the traditional top down TPS approach falls short and a different approach is necessary. The invention disclosed herein departs from the traditional serial TPS structure and implements a heuristic simultaneous parallel response in combination with a 'known good' or 'golden' UUT to establish an operating characteristic response baseline.

OBJECTS AND SUMMARY OF THE INVENTION

An object of at least one embodiment of the present invention is to provide an innovative means for testing a target unit-under-test (UUT) using a mixed signal parallel test methodology versus a traditional top-down serial test approach. The parallel test approach eliminates traditional switching within the signal path and all of the shortcomings associated with such traditional switching. The parallel approach may utilize a digitizing instrument implemented as a plurality of high speed analog-to-digital converter (ADC) channels each targeting a specific signal node of the target UUT. These nodes may be input or output signals or intermediate signals that are processed by the target UUT.

An object of at least one embodiment of the present invention is to provide to a test program set (TPS) developer, a method for analyzing usable support documentation for the target unit-under-test (UUT) to derive circuit operation/behavior and to identify individual components that could degrade or fail. Following analysis, the TPS developer would implement stimulus waveforms that, when applied to the target UUT, would expose the faulty operation of the failed component(s) when captured with appropriate instrumentation.

It is another object of at least one embodiment of the present invention to create configuration files necessary for configuration of stimulus and acquisition (capture) instrumentation. Each file contains a collection of records pertaining to a particular instrument or function. On the stimulus side, a stimulus configuration file would be saved which would provide all of the necessary programming parameters for the instrumentation or equipment necessary for generating the stimulus waveforms to be applied to the target UUT. Similarly, on the acquisition side, an acquisition configuration file would be saved which would provide all of the necessary programming parameters for the instrumentation or equipment necessary for capturing the output UUT waveforms in response to the input stimulus waveforms. In a preferred embodiment, the stimulus configuration file would be automatically generated, for example, by the TPS developer and/or the invention application software.

It is yet another object of at least one embodiment of the present invention to capture UUT waveforms by a digitizing instrument and, either manually or automatically, analyze these waveforms in parallel by software supplied with the invention. A software algorithm for evaluating timing and amplitude at every sampled time interval and a user-specified tolerance would be applied to produce an allowed signal envelope which defines the normal operating conditions of the target UUT. Instead of focusing on traditional (individual) metrics, waveforms are organically evaluated allowing for parallel analysis resulting in improved detection and throughput.

It is yet another object of at least one embodiment of the present invention to sequentially induce simulated UUT faults, via modifying target UUT circuitry to temporarily include these faults or via software such as SPICE (Simulation Program with Integrated Circuit Emphasis) or similar simulation program. A digital logic simulator (Simeon, LASAR, HITS, etc.) may be implemented within the invention for more thorough coverage of logic tests and resultant fault callout messages. In a preferred embodiment, the fault insertion process is automated through use of a software application programming interface (API) to the simulation program which would allow a fault dictionary to be populated through virtual faults such as shorts and opens (as well as others known to those skilled in the art) to be induced programmatically.

The resulting digitized waveform(s) and fault dictionary data signal envelope(s) would be saved to a data file on the computer, and additionally, a text string denoting the actual fault that these waveforms correspond to along with the components and/or circuits to replace/repair. For ease of discussion, any references within this application relating to computer file storage shall be assumed to mean one or more non-transitory computer readable medium storage.

It is yet another object of at least one embodiment of the present invention to store a plurality of the data files, resultant digitized waveforms along with signal envelopes created from multiple or all of fault insertions to a common file directory resulting in an automated waveform analysis fault dictionary. Use of a fault dictionary based on a database of failing waveforms in lieu of diagnostic testing associated with the traditional top-down approach further improves test throughput. During actual test execution, a stimulus configuration file, resident in a common file directory, would be read by application software and automatically program/trigger stimulus instrumentation to produce required stimulus waveforms. Also during actual test execution, an acquisition configuration file, resident in the common directory, would be read by application software and automatically program/trigger the acquisition instrumentation to digitize target UUT output waveforms.

It is yet another object of at least one embodiment of the present invention to have application software sequentially process a plurality of responses representing component and/or circuit faults to find the closest or exact waveform(s) match in order to identify the failed component and to return the fault callout message to the operator. The UUT test waveform would be automatically aligned to each fault waveform in the automated waveform analysis fault dictionary using, for example, a mathematical alignment process to remove the possibility of false negatives resulting from asynchronous signal acquisition. Fault analysis signature waveform(s) would then be applied to the test waveform(s) to test for a match to a specific fault.

It is yet another object of at least one embodiment of the present invention to optimize the sequencing of the tests or evaluations which form the tests. Sequence optimization is achieved by having the application software keep a running count of the number of times each fault lookup was successfully matched to the UUT test waveform in the automated waveform analysis fault dictionary and maintain a sorted list based on those counts. The application software would utilize the sorted list to sequence the data files in such a manner to execute the test or evaluation with the highest running count first followed by tests or evaluations with decreasing running counts to permit a more efficient testing or evaluation order.

It is yet another object of at least one embodiment of the present invention to have a default callout entry stored in the automated waveform analysis fault dictionary which represents non-detectable callouts to return to the operator in the event that the automated waveform analysis fault dictionary does not contain a match for the UUT fault. If no match is found for the UUT, the individual error callout messages may be based upon the combinations of waveforms that failed. Under these circumstances, the failing condition is flagged as a conditional callout message—if the same condition is encountered again, the operator can confirm whether the prior default callout was proper, leaved it flagged as conditional or enter a different callout for the failing condition.

If a failing conditional callout is encountered several times without confirmation (such as three, or other value defined by the TPS developer), the conditional flag is removed and the callout status changed to permanent. In this sense, the TPS becomes a "measure once, analyze many" concept—it can 'learn' new callouts or faults that are added as entries to the fault dictionary without the need for program changes. The operator also has the ability to modify callouts as needed to address deficiencies in the original TPS. These changes are maintained in a separate file in the common file directory.

Classic forms of measurement instrumentation, such as counter, DMM, scope, etc., connected through switching networks are replaced with a single digitizing instrument in embodiments of the disclosed invention. Unique benefits over conventional automatic test equipment (ATE) are numerous, and include but are not limited to: elimination of legacy ATE instrumentation used for traditional measurement metrics reduces tester cost and results in a more compact footprint; reduction of the number of instrumentation types enhances supportability while reducing spares cost; elimination of mechanical switching reduces tester cost and intermittency issues, reduced TPS development time and cost due to tightly integrated software toolset suite; better fault detection through a more thorough evaluation of UUT waveform signals; simultaneous evaluation of mixed mode signals (analog/digital); and quicker TPS execution time due to re-sequencing of tests based on match frequency.

It is yet another object of at least one embodiment of the invention to incorporate a scoring technique to assign a score to waveform matching, with the waveform being analyzed relative to multiple, different known waveforms, so that when a fault is present in the waveform being analyzed, a list of the most likely faults is provided. If the waveform being analyzed does not include a fault, then the scoring would provide an indication of the matching of the waveform to a known good waveform, i.e., one without faults. This scoring technique may be incorporated into the various waveform analysis techniques described above.

The invention will be described in detail with reference to some preferred embodiments of the invention illustrated in the figures in the accompanying drawings. However, the invention is not confined to the illustrated and described embodiments alone.

BRIEF DESCRIPTION OF THE DRAWINGS

Additional objects of the invention will be apparent from the following description of the preferred embodiment thereof taken in conjunction with the accompanying non-limiting drawings, in which.

DETAILED DESCRIPTION OF THE INVENTION

The invention disclosed herein is believed to represent a radical departure from most if not all traditional test program set (TPS) approaches for automated testing of electronic and avionic assemblies. Rather than trying to be all encompassing, the test station architecture as disclosed represents a more economical test approach when all metrics are compared: lower test cost, lower interface test adapter (ITA) cost, faster development time (resulting in lower labor cost) and faster execution time (more throughput), just to name a few.

Figure 1:
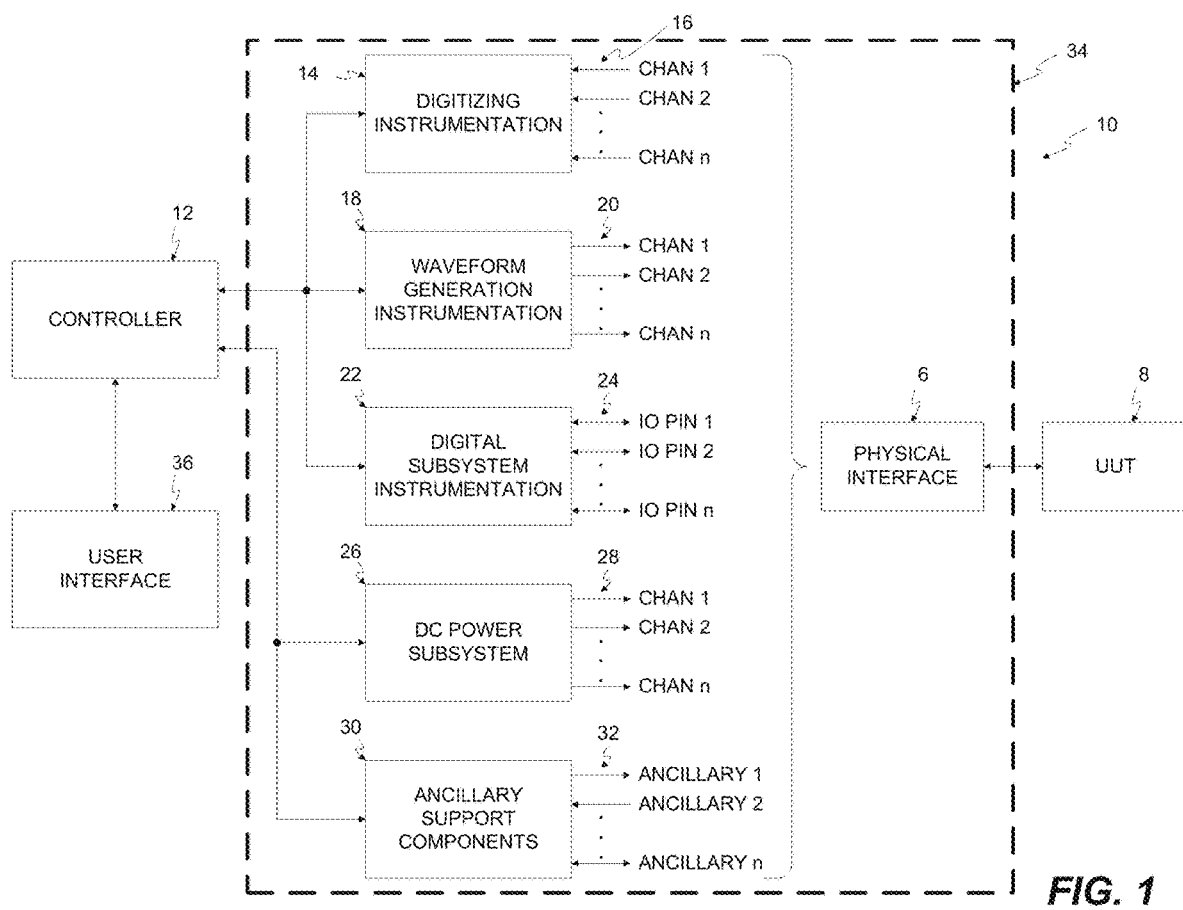
FIG. 1 shows a simplified interconnect diagram for an embodiment of the invention.

An interconnect diagram shown in FIG. 1 represents the basic approach to hardware within a proposed mixed signal test station 10 in accordance with the invention (also referred to herein at times as a tester or testing system). In a preferred embodiment, the instrumentation would be realized using modular-based elements such as the PXI form factor due to its scalable nature, small volume footprint and ubiquitous presence throughout the test instrumentation industry. This means that each component of the test station 10 described below may be a self-contained module with its own housing, and which enables easy assembly of test station 10 by securing the modules and connecting them together on a common platform or within a larger common housing. Other embodiments may implement rack and stack or other modular form factors, either in whole or in part as part of the hardware implementation of the test station 10.

Thus, the described components of the proposed mixed signal test station 10 may be contained in a single housing 34, represented by the dotted line. The housing 34 is provided with suitable power components and cooling components, as well as any other components needed for operation of the interior components of the test station 10 described below. Embodiments of the test station 10 with various hardware and software components described below, and any combinations thereof, are considered inventions herein.

A controller 12, preferably implemented as some form of laptop computer but not limited to such a controller, serves as the main repository of the suite of application software as well as any developed TPSs for the tester. Controller 12 generally serves as control unit to perform the control functions of the mixed signal test station 10, which include preparatory testing stages, such as generating test files using a fully functional UUT, and actual testing of UUTs having possible faults.

This controller 12 preferably interacts remotely with the instrumentation in the mixed signal test station 10 and in the case of PXI instrumentation may take the form of a system (aka 'Slot 1') controller with remote connectivity to the laptop computer via a MXIe (Multi-system Extension Interface Express) link which is used to extend the high speed architecture of the computer bus to that of the PXI backplane. The remote connectivity may take multiple forms (i.e., fiber optic or copper link) or any of the MXI variants currently in use (MXI, MXI-2, MXI-3, MXI-4, MXIe, MXIe x4, MXIe x8, etc.) or other PC bus extension topologies such as Ethernet, USB, Firewire or other appropriate high speed bus.

In a preferred embodiment, the laptop computer containing the controller 12 would be eliminated and the computer would be implemented as an embedded element running, for example, a Windows™ operating system housed within the confines of the tester enclosure, i.e., within the housing 34 with access to user interfaces needed to manipulate the embedded element. Alternate embodiments of the controller element may implement other operating systems (i.e. Mac, Linux) in lieu of the Windows™ software.

At the heart of the mixed signal tester 10 is a subsystem 14 employing digitizing instrumentation that permits simultaneous analog sampling across a plurality of channels 16, also referred to as a set of channels. In a preferred embodiment, each channel 16 would be capable of a minimum sampling rate of 2 Megasamples/second/channel (MS/s/ch) although this sampling rate could be scaled up/down as dictated by the test application requirements. The plurality of analog sampling channels 16 would also need to support independent channel signal scaling (multiple bipolar voltage ranges) such that the input signal amplitude could be optimized relative to the full scale range. In a preferred embodiment, a minimum dynamic range of 90 dB for each channel 16 is required which dictates a sampling resolution of at least 16 bits of depth. Instead of mechanical switching, each testable node within the target UUT circuit would utilize a dedicated digitizing channel.

In a preferred embodiment, radio frequency (RF) signals could be analyzed through use of an ultra high speed digitizing module, although cost constraints might currently prevent implementation on more than a few dedicated channels. An alternate embodiment for analyzing RF signals might employ signal downconversion such that the band of interest is downconverted to the baseband range of the analog sampling channels. In either RF embodiment, it would be desirable to have a dynamic range that exceeds 90 dB to allow analysis of signal levels that approach that of thermal noise (kTB). The use of discrete Fourier transforms (DFTs) or fast Fourier transforms (FFTs) would allow these signals captured in the time domain to be analyzed in the frequency domain.

In a general sense, the analog sampling channels 16 and the digitizing instrumentation 14 would typically be configured to sample analog signals from each UUT 8 connected to the test station 10 via the physical interface 6 and convert the sampled analog signals to digitized signals at a high speed. What exactly constitutes "high speed" sampling and ADC (analog to digital conversion) is variable, but readily understood by those skilled in the art to which this invention pertains by reviewing and understanding the disclosure herein. A set value of this high speed is therefore not believed to be necessary.

The software running on the tester computer, i.e., executed by controller 12, would likely be part of an integrated toolset suite of applications available to the controller 12, e.g., in non-transitory computer-readable medium storage, that consist of, but are not limited to: a test executive, automated waveform analyzer, TBASIC engine, test result logger, analog circuit modeler/simulator/analyzer, digital circuit modeler/simulator/analyzer, analog simulator post processor, analog fault dictionary with learning mode, digital simulator post processor, digital fault dictionary with learning mode, parameterized memory based arbitrary waveform generation (also referred to as 'Arb' or 'AWG') and multiple graphic user interfaces (GUI) for instrumentation. The digitizing instrumentation coupled with the invention's unique automated waveform analyzer software form a powerful development tool.

In a preferred embodiment, the mixed signal tester 10 also includes a subsystem 18 with a plurality of waveform generation channels 20, i.e., a second set of channels. The waveform channels 20, more commonly referred to as arbitrary waveform generators (also referred to as 'Arb' or 'AWG') can produce commonly used bipolar analog/RF signals such as sine, square, triangle, sawtooth, pulse, noise and others known to those skilled in the art. A preferred embodiment would have requirements similar to the digitizing instrumentation 14—a minimum dynamic range of 90 dB for each output channel 20 (at least 16 bits of resolution) at an update rate of 2 MS/s/ch. In alternate embodiments, the AWG channel(s) may employ significantly higher update rates to support generation of RF signals or may be replaced and/or augmented by synthesizers to permit the sourcing of RF signals. These AWG channels 20 are used to provide stimulus to the UUT to mimic the in-situ environment in which the UUT operates.

Also in a preferred embodiment, the tester also includes a digital subsystem 22 supporting a plurality of digital input/output (I/O) pins 24, also referred to herein as a set of channels. At a minimum, these I/O pins 24 support basic 5V TTL logic levels in addition to newer 3.3V, 2.5V, 1.8V, etc. digital variants. In a preferred embodiment, the I/O pins 24 support a nominal programmable logic level in the range of 1-40 volts at a minimum clock rate of 10 MHz. In the preferred embodiment, all sections of hardware instrumentation support triggering to allow signal coherency across the various instrumentation subsystems.

Target UUTs generally require a DC power for operation. The invention disclosed herein includes a plurality of programmable power supplies 28 aimed at supporting/testing target UUTs, collectively referred to as a DC power subsystem 26. The power supplies 28 are also referred to herein as a set of channels. These power supplies 28, in various voltage/current ranges utilize a minimum of 12 bit programmable resolution (which permits milliVolt or better programmability). Current limiting circuitry within the supplies allows selection of constant current operation or supply shutdown if the specified current limit value is reached. Remote sense lines may be provided to allow a precise voltage level to be supplied to the target UUT.

Most TPSs employ a plurality of safe-to-turn-on tests using a switched digital multimeter (DMM) in order to assure a voltage rail is not shorted which could potentially damage the UUT. Since the invention may optionally employ a DMM and switching, a novel approach of current limiting and voltage measurement to determine whether a voltage bus (or rail) is safe to have voltage applied and further reduces the reliance on mechanical switching when these elements are not present.

Alternate embodiments of the invention may provide for the inclusion of ancillary support elements, components, hardware or equipment 30 for electronics assemblies that require varying forms of stimulus to facilitate operation, provided by ancillary inputs and outputs 32, also referred to as a set of channels herein. While it is advantageous to make the mixed signal tester 10 as inclusive as possible, it may be more cost effective to evaluate a group of target UUTs from potential electronics platforms to find a common need for any ancillary support. This hardware may take the form of differential line drivers and/or receivers, static digital latch, complex digital logic (in the form of a field programmable gate array or FPGA), DMM, oscilloscope, form 'C' and/or general switching, and others known to those skilled in the art. Incorporation of commonly needed ancillary support components 30 into the tester can potentially broaden the audience of UUTs, reduce (or eliminate) the need for active interface test adapters (ITAs) and reduce the development effort necessary by migrating redundant design efforts at the TPS level into the tester. Other embodiments may implement ancillary support components 30 in the form of an active ITA, personality module or even an augmentation module to the tester.

The ancillary support components 30 may also be considered to include a radio frequency testing subsystem, including for example, the ultra high speed digitizing module mentioned above and/or the downconversion module, and a plurality of channels connected to the radio frequency testing subsystem. The radio frequency testing subsystem enables testing of radio frequency components and functional units of the UUT 8 when coupled to the mixed signal test station 10 via radio frequency signal transfer to and from the UUT 8 when coupled to the test station 10 using the channels 32.

The mixed signal tester 10 interfaces to the target UUT 8 through some form of physical interface 6. The physical interface 6 may simply be an interconnecting cable between the tester 10 and the target UUT 8 or may optionally include a holding fixture as dictated by the target UUT physical interface. Passive and/or active components may be implemented in the form of an optional personality card or module. A preferred embodiment would utilize adjustable card guides to allow a broad range of target UUTs to be used with the tester 10 without the need for additional fixtures.

The physical interface 6 is preferably connected to the mixed signal test station 10 and configured to support, or be connected to, a plurality of differently configured target UUTs. As such, the physical interface 10 can be connected to one UUT at each time, with it being connected to one particularly configured UUT at one time and then to a differently configured UUT once testing of the first UUT is finished. The physical interface 6 is highly versatile and facilitates testing of multiple and differently configured UUTs using the test station 10.

The TPS development effort for the disclosed invention can be either a solely manual approach (circuit analysis and fault insertion performed by the TPS developer), or a completely computer analyzed approach (circuit analysis and fault insertion using circuit simulation/analysis program) or a mixture of both. In a preferred embodiment, a SPICE (Simulation Program with Integrated Circuit Emphasis) or similar simulation program would be included as part of the software toolset suite to assist with TPS development. A digital logic simulator (Simeon, LASAR, HITS, etc.) would complement the SPICE simulator to provide coverage for digital circuitry as well.

Figure 2:
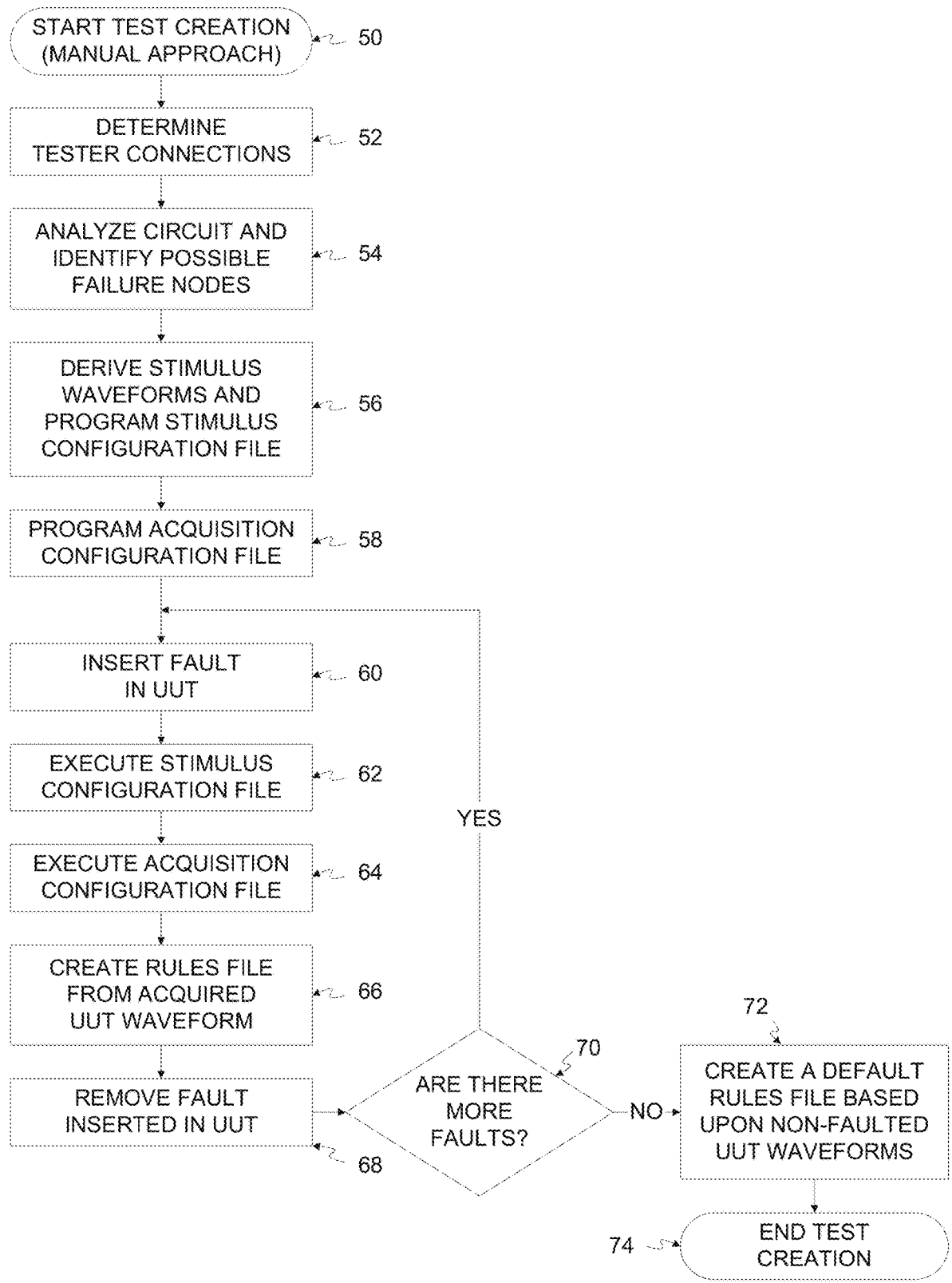
FIG. 2 reflects the steps/flow of manually creating a test for an embodiment of the invention.

The flowchart in FIG. 2 reflects how a single, exemplifying, non-limiting test would be created using the manual approach, step 50, i.e., a test preparation stage. A target UUT 8 would be reviewed as to the best manner in which to connect to the mixed signal tester 10, step 52. It is generally preferred to keep the ITA (or personality module) passive wherever possible so that ITA does not require self-test.

Input, output and bi-directional signals of the target UUT 8 would be mapped to appropriately matched connections or assets on the mixed signal tester 10, which mapping is a known technique to those skilled in the art to which this invention pertains. All schematic diagrams would be reviewed by the TPS developer to identify possible failure nodes where signals could connect to the digitizing channels of the tester, step 54. From the schematic diagrams, the TPS developer would formulate how the target UUT would connect to the tester 10 and determine if any additional passive or active hardware is necessary to recreate an environment in which the target UUT 8 would normally operate. Passive and active hardware could be implemented in the form of a removable personality module. Any holding fixtures, interconnect cabling and hardware would have to be designed, documented and fabricated to allow physical UUT/ATE hookup for TPS development.

Once the TPS developer has designed the required fixtures, cabling and hardware, the target UUT DC voltage requirements and stimuli would need to be identified. Most UUT require some form of stimuli for operation in addition to DC power—these stimuli vary greatly among UUTs and, although not intended to be an exhaustive list, can be analog (i.e., sine, sawtooth, triangle, video, etc.), digital (clocks, enables, counting sequence, address/data bus, etc.) or even RF (radio frequency—continuous wave, pulse modulated, etc.) in nature. The TPS developer would use the invention's software toolset suite to establish a set of stimulus configuration file(s) necessary to recreate the UUT's normal operating environment, step 56.

Figure 3:
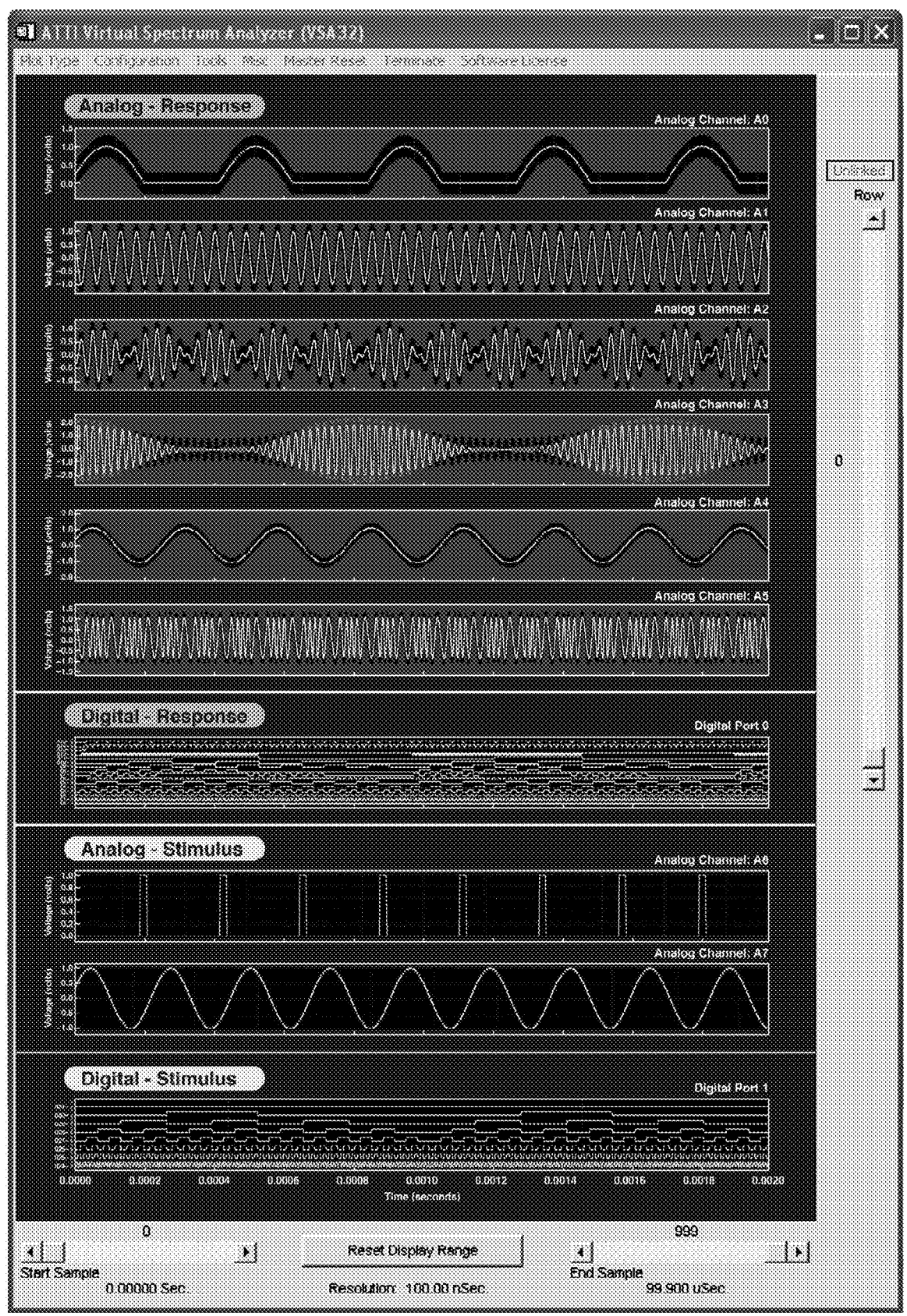
FIG. 3 depicts a portion of the graphic user interface (GUI) of the software toolset suite for stimulus configuration for use in the invention.

A screen capture of the software toolset suite to generate the stimulus configuration file(s) is depicted in FIG. 3. The configurations file(s) may take the form of several types of files, most notable of which are:

'.mcr' macro file—used to define all instrumentation setup

'.dpg' digital pattern generation file—used to define digital I/O vectors although other configuration files may be necessary to support ancillary support equipment.

Optional embodiments may include the ability to generate code for higher level programming languages such as 'C', TestBASIC™, etc. for macro debugging. After establishing the stimulus waveform configuration file(s) in step 56, the acquisition side of the tester must be programmed, step 58. The acquisition configuration file(s) have a default '.pdc' extension as part of the storage file name. The .pdc defines all parameters relating to the acquisition portion of the tester—this includes the sampling rate, active channels (rows), etc.

The first pass of acquisition is a special case in that it is performed without any faults inserted to establish a baseline functional reference (aka 'golden waveform') and is also used to create a default condition based upon the non-faulted UUT responses, e.g., the waveforms. The baseline may be a single test or even a group of tests depending on the size and nature of the target UUT 8, collectively, the test or group of tests is referred to as at least one "first test". In most instances, it is desirable to include fault diagnostics as part of the TPS. Limited TPSs that simply screen UUTs for fully functional operation (as called Go/No-Go testing) and indicate just a pass or fail indication are also possible with the disclosed invention. Such a type of testing, known to those skilled in the art to which this invention pertains, is used to screen UUTs as to whether they are usable (fully functional).

A fully functional UUT would be put through its paces and all the tests that would be necessary to screen the UUT would be integrated first. Once this is complete, integration of diagnostic tests (where faults are inserted) would commence (as described herein). Once a TPS is started, the approach (manual/automated) would not change mid-path (i.e., if started out manually (FIG. 2), automated fault insertion (FIG. 6) would not be used, and vice-versa).

During TPS development (that includes fault diagnostics), a fault, step 60 would be physically inserted into the UUT 8 to cause specific circuitry to fail.

Figure 4:
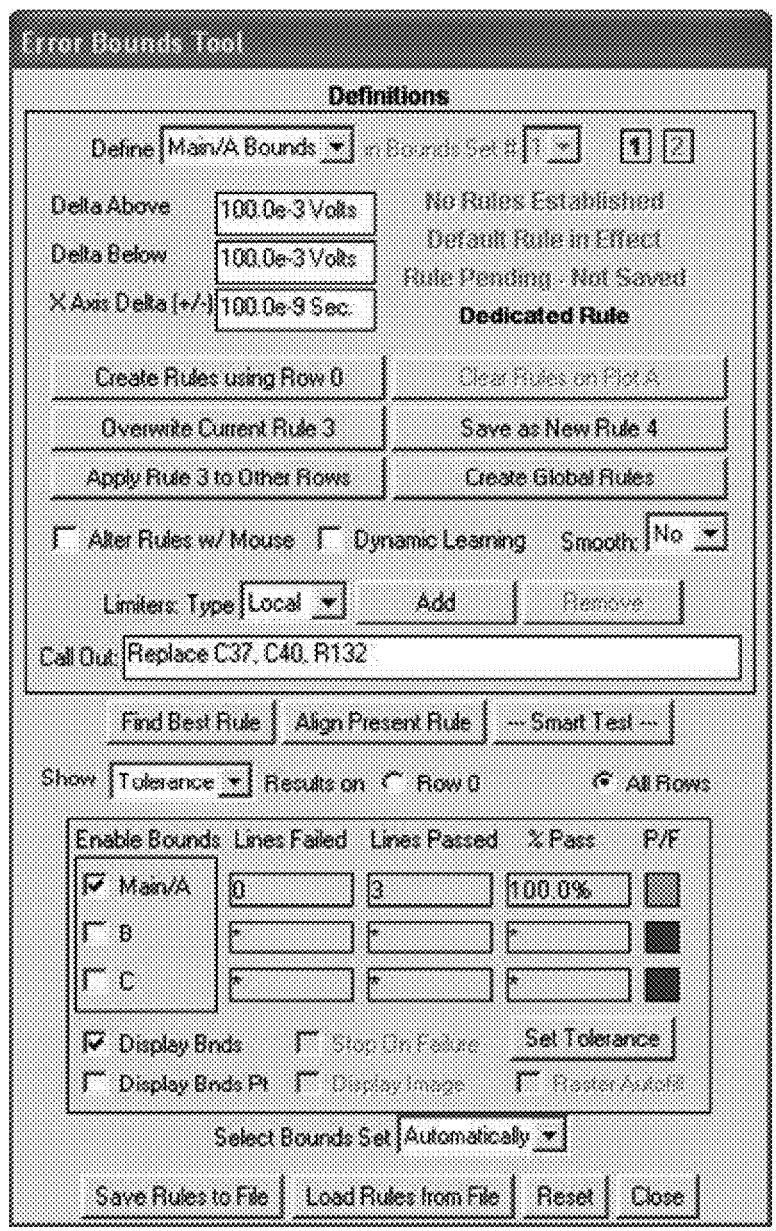
FIG. 4 depicts a portion of the GUI of the software toolset suite for configuring bounds rules for use in the invention.

Following fault insertion in step 60, the UUT would have all stimulus configuration files executed in step 62 such that all stimuli have been applied to provide a normal UUT operating environment followed by the execution of the acquisition configuration file(s) in step 64. After execution of the acquisition configuration file(s) in step 64, a fault signature is recorded. The rules (bounds) file (having a .bnd extension) is created from the acquired UUT waveform in step 66 within the invention's software toolset suite, as depicted in FIG. 4, that defines signal limits for each channel (row), callouts, alignment (correlation rules) and other criteria used to evaluate the plurality of captured signals. The first pass of acquisition is again a special case in that no callouts are used since it represents a passing condition (known good UUT).

Figure 5:
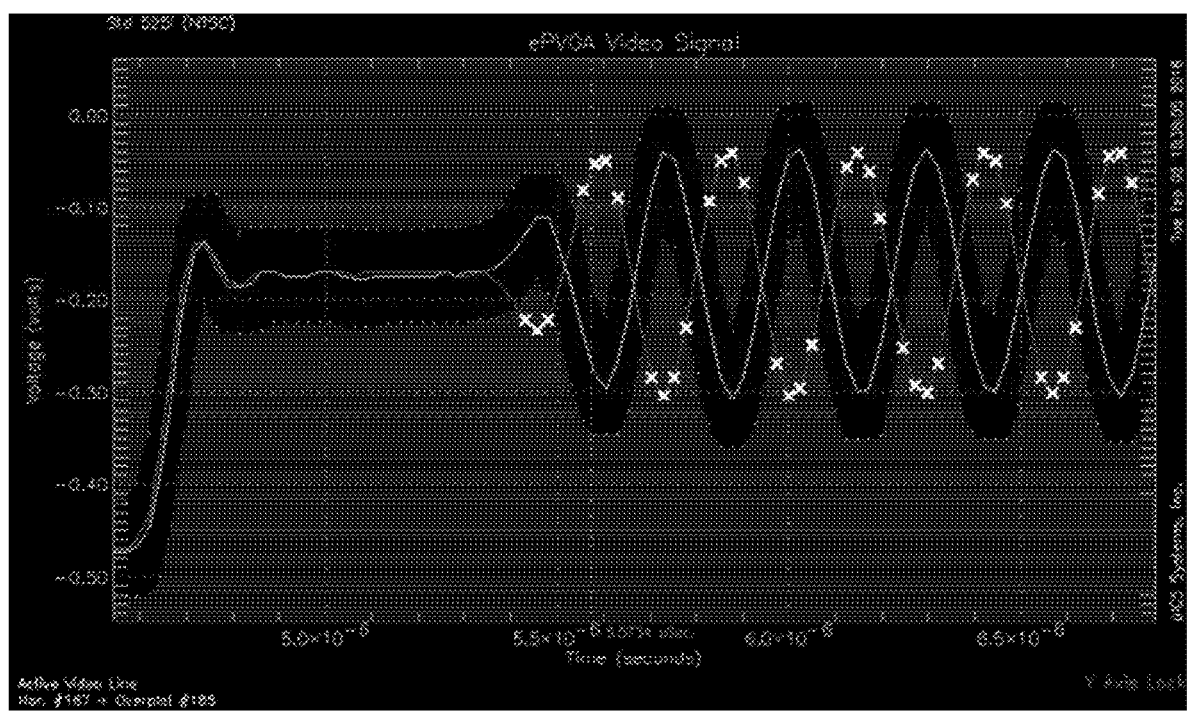
FIG. 5 depicts a portion of the GUI of the software toolset suite for configuring bounds rules for use in the invention.

FIG. 5 depicts passing and failing signal conditions. The passing signal (green) has upper and lower limits which are denoted by the area of hatched lines. The failing signal (red) contains a phase reversal resulting in sample point excursions into the hatched area denoted by the white 'x's. After the rules file is created in step 66, the fault inserted in step 60 is removed in step 68 and the process repeated for any additional faults that have been identified via a determination of the presence of any more faults in step 70. If another fault is sought to be used in the creation of the rules file in step 66, then the process returns to step 60 with this additional fault being inserted. The process then continues with steps 62, 64, 66, 68 and 70 in the form of a fault insertion and processing loop. Ideally, multiple and different faults are inserted.

Once there are no more faults as determined in step 70, a default rules file is created in step 72 based on non-faulted UUT responses, i.e., waveforms, and then the manual approach to test creation ends in step 74.

The TPS test approach embodied by the invention results in a repository of the plurality test files containing golden waveform(s), fault signature waveform(s) from inserted faults, associated stimulus/acquisition configuration files, rules (bounds) files and component callouts validated using a fully functional UUT coupled to the mixed signal test station 10. This repository is used to test UUT of the same type as the (known fully functional) UUT which is used to generate the test files. Generally, received signals responsive to stimulus signals provided to the fully functional UUT (with and without faults) are used to subsequently assess the presence or absence of faults in the UUT being tested. The UUT being tested may be determined to include one or more faults or be fault-free, i.e., fully functional.

Figure 6:
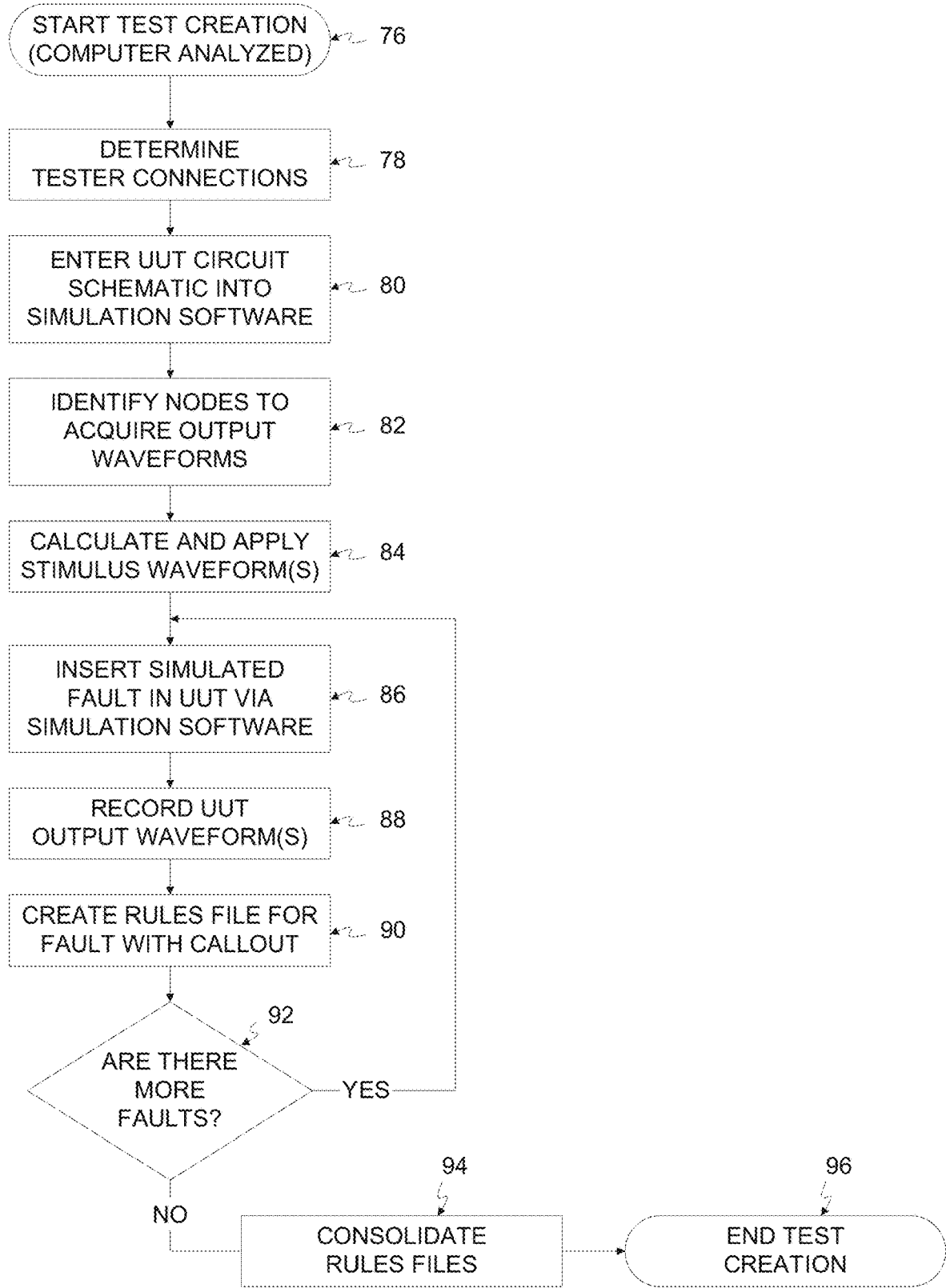
FIG. 6 reflects the steps/flow of creating a computer analyzed test for an embodiment of the invention.

The flowchart in FIG. 6 reflects how a single, exemplifying, non-limiting test is created using the computer analyzed (automated) approach. In this approach, after starting the test creation in step 76, the TPS developer would map input, output and bi-directional signals of the target UUT to appropriately matched connections on the mixed signal tester 10 in step 78 in the same manner as the manual approach, step 52. The target UUT circuit schematic would then be entered into a SPICE or similar circuit simulation software, step 80, to allow automated analysis of the circuit as well as fault insertion. The target UUT DC voltage requirements and stimuli would also need to be identified in step 82, in a manner similar to that of the manual approach, in step 54 wherein nodes to acquire output waveforms are identified. A fully functional UUT is not required for the computer analyzed (automated) approach because the waveforms are simulated/modeled via schematic entered in a simulator. However, as a practical matter, the passing ('golden') waveforms should be verified at a minimum on a fully functional UUT before the TPS is released for use.

In a preferred embodiment, the faults can be simulated or virtually induced via circuit simulation software automatically calculating the signals at each of the measured node points, effectively reducing or even eliminating the need to introduce physical faults within the target UUT. This is indicated by step 84 of calculating and applying stimulus waveforms. Whether the fault is simulated (virtually induced) or physically inserted in step 86, a fault signature needs to be defined through the use of a rules (bounds) file that defines signal limits for each channel (row), callouts, alignment (correlation rules) and other criteria used to evaluate the plurality of captured signals similar to what was done in the manual approach.

Step 88 provides for recording of the UUT output waveforms, while step 90 provides for creating a rules file for the fault with callout. After the rules file is created in step 90, if the fault was physically inserted, it would be removed (this step is not shown in FIG. 6 but is shown in FIG. 2) and the process repeated for any additional faults that have been identified via a determination of the presence of any more faults in step 92. If another fault is sought to be used in the creation of the rules file in step 90, then the process returns to step 86 with this additional simulated fault being inserted. The process then continues with steps 88, 90 and 92 in the form of a simulated fault insertion and processing loop.

When there are no more simulated faults to insert, it is important to determine the uniqueness of each rules file and whether a specific fault matches its specific rules file and no other. After all the rules files have been created, each simulated fault waveform is compared to each and every rules file to make sure that there is only one rules file which matches it. If more than one rules file is determined to be matching, one of two corrective actions may be taken.

First, if each group of matching rules files contains a reasonable small number of component callouts (i.e., two or three), the operator can specify to automatically consolidate those similar rules files into a single rules file and have the new rules file identify the group of component callouts to replace whenever this fault signature is matched in step 94. The maximum size of the component group may be specified by the operator.

Alternatively, each similar rules file can be manually examined to determine if the allowed X and Y axis tolerance values might be altered in such a way as to prevent other near-identical fault waveforms from matching. For example, the X axis tolerance may be made smaller (tighter) so that it is more unlikely for other similar faults to match an incorrect rules file. When no further consolidation is possible, the process ends at step 96.

In order to prevent 'contamination' of the fault dictionary, it is generally good practice to repeat the golden test(s) with a passing condition to insure the target UUT 8 was not damaged by the insertion of a physical fault. Such practices are generally described by a tester TPS style guide to insure TPS consistency among a group of TPS developers. Once all faults have been simulated or inserted, it may be necessary to create a default condition based upon the non-faulted UUT responses, i.e., waveforms, as was done in the manual approach.

The software toolset suite would also insure sufficient UUT component testing by comparing a reference bill of materials (BOM) for the target UUT. Often a TPS developer will create a TPS without knowing what percentage of components are addressed by fault callout messages. Upon initial undertaking of a TPS, the TPS developer would enter the BOM for the target UUT. As tests are generated, the software toolset suite would itemize the components specified in the fault callouts. A list of components not contained in any fault callout message would allow the TPS developer to keep track of the components which still need to be addressed as TPS development progresses and insure better test coverage and ultimately a more robust TPS. The software toolset suite would also employ statistical analysis of the captured data. Instead of a single one-shot capture which can result in a false sense of passing circuitry, the invention permits continuous triggering/alignment to determine a pass/fail ratio within any given rules file. This allows for real-time capture of any circuit anomalies and more rigorous testing of UUTs exhibiting intermittent failures.

Figure 7:
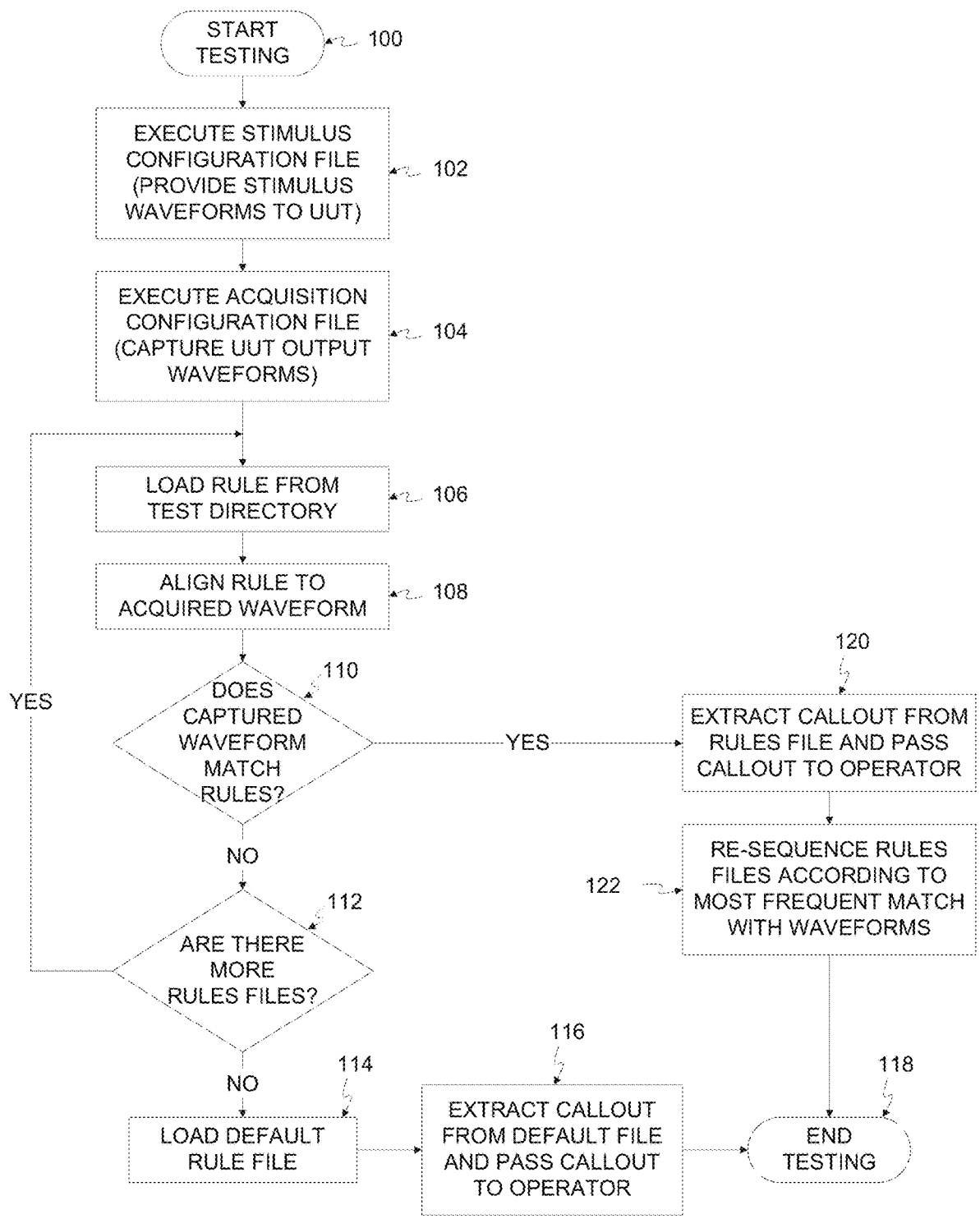
FIG. 7 reflects the steps/flow of running a test within an embodiment of the invention.

The flowchart in FIG. 7 reflects how testing is performed, i.e., the testing stage using mixed signal test station 10, regardless of whether tests were created manually or via the computer aided approach. A single test is contained within a '.tst' test file. The sequencing of tests is determined by a '.seq' file which designates the order in which the tests are intended to run. The '.tst' file contains all of the requisite information for execution of a single test by test station 10 and begins, after the start of testing in step 100, with the loading into controller 12 and execution, by a processing functionality resident in controller 12 and/or test station 10, of the specified stimulus configuration file ('.mcr' macro file containing all of the stimulus configurations and '.dpg' digital pattern generation file information, if applicable), in step 102. At this point, the specified acquisition configuration file ('.pdc' file) is loaded into controller 12 and executed as well, step 104.

Following initial stimulus and acquisition setup, a rules file ('.bnd' file) is loaded into controller 12 that specifies the established rules for matching conditions/alignment/callouts, etc., step 106. Upon execution, the acquired waveforms are aligned to the rules specified in the '.bnd' file, step 108. The aligned plurality of waveforms are then evaluated against the rules contained in the '.bnd' file, step 110. If any evaluation matches as determined by a processor in the mixed signal test station 10 and/or controller 12, the testing terminates and the callout, which denotes the required corrective action, is extracted from the rules file and passed to operator, step 120 (via user interface 36). If the matching evaluation relates to the baseline (golden) waveform(s), a 'UUT ACCEPTABLE' or similar message rather than a callout containing suspect components would be passed to the operator by controller 12 to the user interface 36.

Multiple evaluations may take place within each test and each evaluation is contained within the '.bnd' file. In a preferred embodiment, the order of evaluations is contained within a '.ndx' file. The '.ndx' file is a file that ranks the plurality of '.bnd' files by the number of times each '.bnd' file is matched and creates a hierarchy wherein the most probable '.bnd' file is evaluated first. The '.ndx' file may be automatically re-ordered (to change the evaluation order within a specific test for the following UUTs being tested) by software resident on computer-readable media at the mixed signal test station 10 and/or controller 12 according to the most frequent waveform matches, step 122. In this manner, the most likely failure evaluations within a specific test are analyzed first such that the execution time necessary for evaluation and overall testing can be reduced.

More specifically, in accordance with the invention, a method for evaluating units under test using a test station is envisioned wherein the evaluation sequence is optimized based on earlier results of testing and evaluating. A count of each matching waveform frequency, and thus the most likely failure evaluation, is conducted by the processing unit and a higher counted matching waveform indicates a higher risk of the evaluation failing. For subsequent evaluations, the order of evaluations in the tests is based on the risk of the evaluation failing since often it is desirable to see more quickly which evaluations a UUT fails.

As such, a plurality of evaluations in at least one test for testing the UUTs when each UUT is coupled to the test station is generated by the TPS developer. An initial sequence in which the evaluations are to be performed on a first article of the UUTs when coupled to the test station is generated or determined, e.g., by the TPS developer. This initial sequence is then put into the '.seq' file when created and evaluations are performed on the UUT in accordance with this initial sequence. Each evaluation may be as in any of the embodiments described above, similar in performance to a test. For example, each evaluation may involve providing, using the waveform generating subsystem 18, stimulus signals to the UUT 8 via channels 20 and the physical interface 6, monitoring reception of analog sampling signals by the digitizing instrumentation 14 via analog sampling channels 16, and analyzing each of the received analog sampling signals relative to pre-obtained analog signals associated with the UUT 8 and which reflect the presence of a known fault in the UUT 8 to determine the pre-obtained analog signals which is a closest match to the received analog sampling signal.

The step of analyzing each received analog sampling signal relative to pre-obtained analog signals associated with the UUT 8 and which reflect the presence of a known fault in the UUT 8 does not require that a physical UUT actually have been used to derive the pre-obtained analog signals, and intentionally provided with component faults. Rather, it is possible to use a "virtual" UUT, i.e., one embodied in schematics. As such, the analysis, which is often performed by a processor, is of each of the received signals relative to pre-obtained signals actually received or expected to be received from a fully functional UUT of the same type as the UUT being tested after being provided with the same stimulus signals dependent on whether the UUT is a physical system or a virtual system. The expected received signals should be the same for the UUT whether a physical fully functional UUT is used for their derivation or a virtual (schematically implemented) fully functional UUT is used for their derivation.

The above tests and evaluations are in no way limited just to analog signals. These tests, and the evaluations forming the tests, may also involve the processing of input/output data to/from the UUT using digital subsystem 22, and/or utilize ancillary support equipment and/or sampling of RF signals produced by the UUT 8 using the higher speed sampling channels in one of the aforementioned embodiments. Generally, stimulus signals are provided to the UUT being tested, of one or more different signal types, and responsive received signals are analyzed relative to pre-obtained signals that are received or expected to be received when creating the test file using a fully functional UUT of the same type. As used herein, an evaluation may be considered the same as a test, with the exception that evaluations may be grouped together to form a test. In addition, since the term "evaluation" is subject to semantic interpretation, an evaluation may be any type of analysis that looks at one criteria of the signal (e.g., pulse rise time) or, in the alternative, it could look at a range of similar criteria (e.g., pulse rise time, pulse fall time, pulse width, pulse period, pulse duty cycle, etc.).

Upon the controller 12 determining which received sampled signal is a closest match to each pre-obtained signal, the identity of the known fault associated with the closest matching pre-obtained signal is retrieved, again using controller 12. In a preferred embodiment, the controller 12 would be coupled to some form of user interface 36 (e.g., display/keyboard/mouse/speakers/etc.) to convey the identity of the known fault and a possible corrective action to take or indicate that no fault is present in the connected UUT. The user interface 36 may provide a visual indication to the test personnel via a display system and/or an audible indication via a sound generating system functionality of the user interface 36.

Generally, mixed signal test station 10 is configured to generate a report of the testing by the processing unit of the UUT being tested in one of a variety of ways and formats, e.g., an audible report, a visual report, an electronic communication (e-mail or message) or a physical report, and the manner in which each of these can be generated is obvious to those skilled in the art to which this invention pertains in view of the disclosure herein. Thus, such report generation may be, but is not limited to, the generation of the visual display or audible indication of results of UUT testing via the user interface 36.

An alternate embodiment of the disclosed invention also includes tracking the frequency of each test failure similar to that of the '.bnd' evaluations within each test. In this embodiment, the initial sequence of tests is revised based on the frequency that each test results in detection of a known fault notified to the operator via the user interface 36, e.g., via modification of the '.seq' file. This minimizes unnecessary testing and as a result, tests that more frequently result in the detection of a known fault are ordered in the revised sequence of tests before tests that less frequently result in the detection of a known fault. This process can continue with repeated changes to the '.seq' file during each TPS use on the mixed signal test station 10. In more specific embodiments, it is possible to maintain the original evaluation ordering file ('.ndx') as well as the original test sequence file ('.seq') on computer-readable memory storage medium.

The testing is then finished in step 118. If the evaluation in step 110 does not match and there are determined to be more rules files in step 112, the next rule is loaded/executed until there are no more rules to verify, a rules verification loop is thus formed by steps 106, 108, 110, 112. If this point is reached after the negative determination in step 112, a default rule is loaded in step 114, evaluated and the callout would be passed to the operator, step 116 before the testing finishes in step 118.

Generally, based on the flowchart in FIG. 7, a method for testing a UUT 8 in accordance with the invention includes generating a plurality of test files for testing the UUT using a UUT of that type that is known to be fully functional, the plurality of test files including at least one file containing data about a golden waveform, at least one file containing data about a fault signature waveform, stimulus/acquisition configuration files associated with the golden waveform and the fault signature waveform, at least one rules (bounds) file and at least one component callout, the test files being stored in at least one computer readable memory medium storage and constituting an automated waveform analysis fault dictionary. The UUT 8 being tested is coupled to the mixed signal test station 10 via physical interface 6.

The controller 12 selects one of the test files based on characteristics of the UUT 8 being tested, e.g., based on input from the test operator via a user interface 36 or automatically based on communications with the UUT 8 via the physical interface 6. For example, it is possible to configure the controller 12 and mixed signal test station 10 such that information about the UUT 8 being tested is obtained and provided to the controller 12 or processor at the test station 10, upon which a determination is made by the controller 12 or processor at the test station which one of the test files is designed for testing the UUT 8 based on the obtained information. A test file for the same type of UUT is sought. This determination may be made by reference to a list of UUTs for which each test file is suitable for use.

The selected test file is retrieved from computer readable memory medium storage associated with or accessible to the controller 12. A processing unit in the controller 12 performs testing of the UUT 8 by using tests, files, data, etc., in the retrieved selected test file. Visual display or audible indication of results of the testing of the UUT 8 coupled to the mixed signal test station 10 can be provided via the user interface 36.

In one embodiment, generating the test files entails, in test preparation stage when the UUT 8 being tested is not yet coupled to the test station, determining connections between available assets associated with the test station and the connections of the UUT 8 known to be fully functional, analyzing a circuit including the fully functional UUT 8 and identifying failure nodes where signals connect to the various channels of mixed signal test station 10. It is extremely important that the UUT 8 must be a fully functional, known good assembly before generating test files because otherwise a fault in the UUT being tested may not be detected, e.g., if it is the same fault as present in the UUT used to generate the test files. A set of stimulus configuration files to recreate an operating environment of the UUT 8 that is considered normal and determining a set of acquisition configuration files to acquire signals from the UUT 8 is also part of the test generation.

Each first test, or each of a series of first tests, of the fully functional UUT 8 without any faults inserted is accomplished by directing a stimulus waveform to the UUT 8, receiving a waveform in accordance with the stimulus/acquisition configuration files and generating a rules file from the received waveform to establish a baseline functional reference considered the golden waveform thus creating a default condition based upon the non-faulted UUT response, i.e., waveform. Depending on the complexity of the UUT 8, multiple (first) tests may be required to establish a golden set of waveforms that reflect the normal operating state of the UUT 8.

Following the initial golden waveform test(s), at least one additional test of the fully functional UUT 8 is performed or conducted by physically inserting a fault into a component of the UUT 8 and then directing the stimulus waveform(s) to the UUT 8, receiving the waveform in accordance with the stimulus/acquisition configuration files. Another rules file would be generated based on the received waveform of the intentionally faulted, but otherwise fully functional UUT 8, which should differ from the golden waveform(s) and tagged with information reflecting the fault inserted into the UUT 8.

An alternative technique to generating the test files manually entails determining connections between available assets or connections associated with the computer and the connections of the UUT 8 known to be fully functional, entering a circuit including a schematic of the UUT 8 into circuit simulation software, executing the circuit simulation software to analyze failure nodes where signals could connect to the various channels of mixed signal test station 10. The simulation software would ideally also identify locations of potential faults, determine a set of stimulus configuration files to recreate an operating environment of the UUT 8 that is considered normal, and determine a set of acquisition configuration files to acquire signals from the UUT 8.

The first test of the fully functional UUT 8 is analyzed or performed without any faults inserted by directing a stimulus waveform to the UUT 8, receiving a waveform in accordance with the stimulus/acquisition configuration files and generating a rules file from the simulated waveform to establish a baseline functional reference considered the golden waveform and create a default condition based upon the non-faulted UUT response.

As was the case with the manually inserted faults, multiple (first) tests may be required to establish a golden set of waveforms that reflect the normal operating state of the type of UUT 8 depending on its complexity. Following the initial golden waveform test(s), at least one additional test of the fully functional UUT 8 would be simulated by inducing a virtual fault within the UUT 8 and then directing the stimulus waveform(s) to the UUT 8. The resulting waveform simulation in accordance with the stimulus/acquisition configuration files would be recorded and another rules file would be created based on the simulated waveform from the virtual fault inserted in the UUT 8. A rules file would be generated based on the simulated waveform of the virtual fault within the UUT 8, which should differ from the golden waveform(s) and tagged with information reflecting the virtual fault used to analyze the UUT 8. The manner in which this tagging is implemented may be via a software routine to link data.

Generating test files involves the creation of stimulus configuration files that each store all programming parameters necessary to recreate a normal operating environment of a respective one of a plurality of different components and functional units of the fully functional UUT 8 by generating the stimulus waveforms to be applied to the UUT 8 which cause the UUT 8 to operate in accordance with its normal operating environment. The generated stimulus configuration files are included in each of the test files. Similarly, test file generation also involves the creation of acquisition configuration files that each store all programming parameters for a respective one of a plurality of different components and functional units of the UUT 8 that enable capture of output waveforms from the UUT in response to the input stimulus waveforms. The generated acquisition configuration files are also stored in each of the test files.

In preferred embodiments, when the waveforms stored in the fault library are approximate representations of the actual circuit faults, such as those derived via software simulation methods (instead of physical fault insertion methods), a unique method of Tolerant Aggregate Scoring may be utilized in the process of determining the present fault, or the most likely fault present in the waveform being analyzed. This method has the benefit of always successfully producing a ranked 'most-likely' fault list (from the fault library) for the acquired waveform(s) independent of the signal quality and format, and even for mixed signals (parallel analog and digital waveforms).

Figure 8:
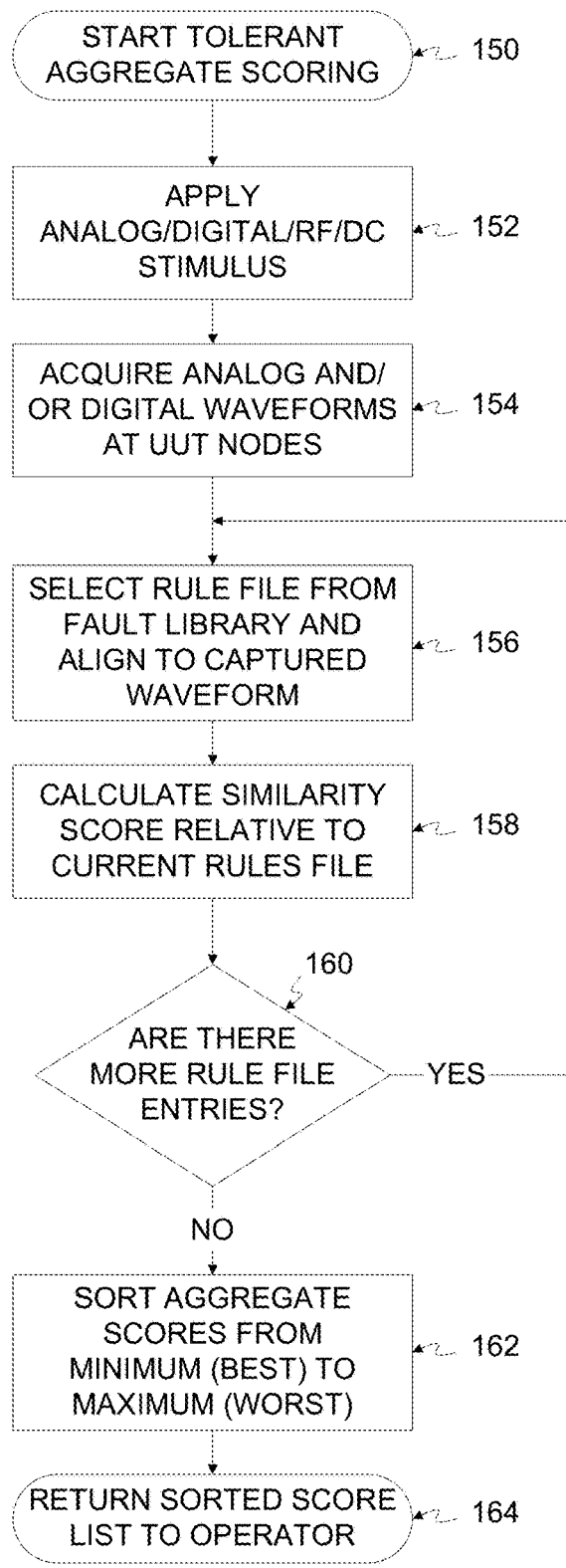
FIG. 8 reflects the steps/flow of tolerant aggregate scoring within an embodiment of the invention.

FIG. 8 depicts how Tolerant Aggregate Scoring is implemented. When Tolerant Aggregate Scoring is invoked (started) in step 150, all stimuli (analog, digital, DC, RF, etc.) are applied to the UUT in step 152 from a stimulus signal source coupled to the UUT (see FIG. 1). The stimulus signals may be applied in parallel, e.g., analog, digital, RF and DC signals being applied simultaneously to different inputs of the UUT from the stimulus signal source(s). The sources for the stimulus signals may be any of the signal sources illustrated in FIG. 1 that are capable of providing a signal to the UUT upon command by the controller 12 via the sets of channels, e.g., waveform generation instrumentation 18, digital subsystem instrumentation 22, DC power subsystem 26, and the ancillary support components 30. Following the application of all stimulus signals from the selected stimulus signal source(s), and in response thereto, analog and/or digital waveforms are acquired in step 154 at the UUT's individual output nodes, either singularly or in parallel. Singularly means that a single waveform is acquired at the output nodes, while parallel means that a plurality of waveforms is acquired at the output nodes. In either case, a set of waveforms is acquired since a set is defined to include one or more waveforms. The output nodes include the structure illustrated in FIG. 1 that is capable of receiving signals from the UUT 8 via sets of channels, e.g., the digitizing instrumentation 14, the digital subsystem instrumentation 22, and the ancillary support components 30.

It is mentioned that Tolerant Aggregate Scoring is invoked. This invoking may take various forms. For example, a program may be designed and configured for a mixed signal test station as described herein to generate a prompt via a notification device (display, audio device and the like) requiring a response by the testing personnel in order to initiate the application of the stimulus signals to the UUT, which response is provided or detected by a user interface coupled to the controller 12. The notification device is coupled to the controller 12. Setting of Tolerant Aggregate Scoring could also be effected using the error bounds tool shown in FIG. 4, i.e., the user interacts with a designated portion of this display screen to initiate the Tolerant Aggregate Scoring. Then, application of the stimulus signals to the UUT is initiated only when the response to the prompt is detected by the notification device itself or possibly other device configured to receive the response to the prompt (a response detection device or user interface) which may also be coupled to the controller 12, i.e., when the Tolerant Aggregate Scoring technique is sought to be applied.

A rules file (either known-good or known-fault) from the fault library is selected from the fault library and the captured waveform(s) are aligned to their respective rule(s) in step 156. The fault library is accessed by the waveform analysis program being executed by the mixed signal test station/system via controller 12. The rules files are described in detail elsewhere, but generally, as applicable to Tolerant Aggregate Scoring, each contains rules and has a representation associated with a waveform that is known to be a good waveform without faults (known-good) or associated with a specific fault in a waveform (known-fault). Selection of one of the rules files from the fault library, which contains a plurality of rules files, is done by a processor that coordinates the Tolerant Aggregate Scoring technique in the mixed signal test station, e.g., controller 12 (see FIG. 1). Alignment of the waveform to the respective rule being undertaken the controller 12 constitutes analyzing whether the waveform is in compliance with the respective rule (has the characteristics of the rule or not) and the degree or extent of compliance or non-compliance (the variance from the characteristics of the rule). This analysis is an example only of the alignment technique and other alignment techniques that achieve the same objective may be used in the invention, consonant with the disclosure herein, and are considered to be with the scope of the invention.

Following waveform/rule alignment, a similarity score is calculated for the acquired waveform in step 158 (or acquired waveform set if waveforms are captured in parallel) relative to the current respective rules in the rules file, e.g., by the controller 12. The similarity score may be considered to be indicative of a degree of matching between the acquired set of waveforms (one or more waveforms) and the rules in the retrieved rules file. Scoring is preferably performed by a software algorithm executing on the host computer utilizing a blend of proprietary metrics, including alignment correlation, combined with the positional differences between the captured waveform and the fault library waveforms, e.g., by controller 12 or associated hardware and software components. Design of this algorithm is within the purview of those skilled in the art to which this invention pertains in view of the disclosure herein. The aggregate score is calculated by, for example, summing the scores of all waveforms in this set, when the set includes a plurality of waveforms, and saving the aggregate score in a list. The list may be stored in memory of one or more memory components associated with or accessible to the processor executing the algorithm, e.g., in or within the box designated controller 12 in FIG. 1.

If additional rules files entries exist in the fault library as determined in query 160, these entries are aligned, scored and added to the list (repeating steps 156 and 158). The fault library is resident in one or more memory components associated with or accessible to the processor performing the algorithm, e.g., in or within the box designated controller 12 in FIG. 1. The fault library may be managed using any of the techniques described above to create and control content of the fault library. After all rule entries in the fault library have been scored, the aggregate scores in the list are sorted in step 162, by the processor or controller 12, from minimum score (best result) to maximum score (worst result) whereas the minimum scoring rules file is the most probable fault/match and the highest scoring rules file is the least likely fault/match. The aggregate scores are stored in a memory component in association with the retrieved rules files, i.e., there is a link in the memory component (such as a table) between the acquired set of waveforms based on the stimulus signals, the scores and the rules files that resulted in the scores (and thus inherently the representation associated with each rules file, i.e., whether it is known-good or the specific fault if not known-good and thus known-fault).

The minimum scoring library entries and their associated fault information are returned to the operator in step 164 for corrective action. In a preferred embodiment, a limited number of the top entries, for example, the top three (3) entries, are returned to the operator. The operator can set the number of top entries being provided in step 164 using an user interface, with the user input via the user interface being converted by the processor, coupled to the user interface and executing the program, into the set number of top entries to be output to the user. If the known-good rules file is the best scoring match, it will be the only entry returned. The manner in which the fault information, or known good status, is returned to the operator or other test personnel may be via conveyance using a conveyance device (e.g., user interface 36). The list of the representation of at least part of the retrieved rules files is conveyed in an order based on the calculated scores. The conveyance device may be a display on which the list of retrieved rules files is displayed in the order based on the calculated scores, and which display is coupled to the controller 12.

The display of the known-good rules file or the top faults may be included on the screen displayed in FIG. 3. The order may be determined by considering a minimum score to be when the acquired set of waveforms is in exact accordance with the plurality of rules in the retrieved rules file (known good) and a maximum score to be when the acquired set of waveforms is not in accordance with the plurality of rules in the retrieved rules file. The calculated scores are sorted using the processor before conveying the list of the retrieved rules files in the order based on the calculated scores.

As such, there are two possibilities for conveyance to the operator via user interface 36. Only the representation of a single rules file is conveyed when the best retrieved rules file is associated with a representation that it is a waveform that is known to be a good waveform without faults. Otherwise, a limited number of the rules files is conveyed when none of the retrieved rules files is associated with a representation that it is a waveform that is known to be a good waveform without faults, i.e., there is a fault and a specified number of most likely faults is conveyed to the operator.

As mentioned above, with reference to the bill of materials (BOM), to ensure the presence of a test for each component or functional unit of the fully functional UUT 8, it is possible to generate at least one test for a first component or functional unit of the UUT 8, and determine whether there are any additional components or functional units of the UUT 8 for which at least one test has not been generated by referring to a list of components and functional units of the UUT 8 using the BOM. This determination may be a manual determination or may be programmed to be effected by the processor in the mixed signal test station 10 or controller 12. When it is determined that there is an additional component or functional unit of the UUT for which at least one test has not been generated, at least one test is then generated for the additional component or functional unit of the UUT 8. The additional component or functional unit presence determination step is repeated until it is determined that there are no outstanding components or functional units of the UUT 8 for which at least one test has not been generated (all of the components and functional units in the UUT 8 (via the BOM) have associated callouts. Thus there is at least one test for every component and functional unit on the list of components and functional units of the UUT 8.

Mentioned above is a rules file, e.g., steps 66, 72 and 90 for creation thereof using a fully functional UUT and step 106 for use thereof for testing the same type of UUT but not known whether it is fully functional or has faults. Such a rules file is an integral component of embodiments of the invention used to enable and execute waveform analysis processes. A single rules file typically contains all of the information necessary for the analysis process to make a determination of whether the current set of test waveforms has sufficient similarity to the acquired waveforms belonging to a specific predetermined fault to merit that determination.

That is, if one of the current set of waveforms is similar to a waveform arising from a fully functional UUT 8 with a predetermined fault, similar to an extent above a threshold, then it is considered that the current (functionality-unknown) UUT 8 is not acceptable and user interface 36 alerts the operator with a callout indicating the predetermined fault. Thus, by analyzing output waveforms from a UUT 8 being tested, upon input of a known waveform, relative to waveforms output from a UUT of the same type as UUT 8 (and known to be fully functional, possibly even the same UUT when it was earlier known to be fully functional) when subjected to different, known faults, the presence of any one of those faults in the UUT 8 being tested can be detected.

Typically, the rules file will be one of a plurality of rules files (denoting most, if not all, of the possible faults of an electronic circuit) and will be stored in a directory, or directories, of rules that will be accessible to the analysis process. Each rules file is embodied in computer-readable memory storage media accessible by a processor when executing a computer program designed to access the rules files. The use of files and directories is a preferred embodiment of rules storage for this invention, but other storage arrangements, such as databases will be obvious to those skilled in the art.

Specifically, the rules file each includes, but is not limited to:

a) Data value parameters supporting and describing the waveform envelope that the test waveform(s) should exist within, such parameters including, but not being limited to, X axis values, upper and lower Y axis values, basis waveform values, rule limiter position values and tolerance position values;

b) Process value parameters defining the values which either existed when the rule was created and used in the rule creation, or to be used to guide how the rule is compared to the test waveform during testing, such parameters including, but not being limited to, error count threshold values, tolerance threshold values, data precision, maximum rule truncation allowed, passing alignment threshold, maximum rule shift allowed, and fulltime alignment flag;

c) structure tables defining the matrix of which rule(s) to apply to a test waveform set which may consist of multiple waveforms; and d) data defining the condition ('golden' or faulty) that the rule waveform represents and/or a corrective action to apply should the test waveform be deemed similar to the rule waveform.

By design, each rules file independently supports a unique circuit fault and may describe entirely different circumstances of how to process its comparison to the test waveform. In an alternative embodiment, each rules file may contain many instances of different faults and their associated support values. In this case, each waveform in the rules file would be analyzed against the test waveform and when a positive comparison is made, the fault callout for that specific waveform in the rules file would be returned to the operator.

One of the advantages provided by embodiments of the invention is that it provides for simultaneous asset use using a parallel test approach. Since all channels of all instrumentation assets, e.g., sets of channels 16, 20, 24, 28, 32, can be operated/analyzed simultaneously the typical signal bottleneck is eliminated. This approach allows testing of multiple signal nodes of a single UUT resulting in a substantial reduction in test program set (TPS) runtime when compared against the traditional serial functional test approach.

To this end, the physical interface 6 shown in FIG. 1 may be an interface system having a number of interface components and by providing multiple interface components, the interface system can be configured to support a plurality of UUTs. Since most UUTs have unique interface requirements, the physical interface 6 would be tailored for each specific UUT 8 that would connect to the test mixed signal station 10. More specifically, a respective stimulus signal can be provided each of the waveform generation channels 20, digital subsystem 10 pins 24, DC power channels 28 or ancillary support component channels 32. One or more respective analog/digital/RF/ancillary signal inputs can be received from the signal nodes of the UUT 8 by the digitizing instrumentation channels 16, digital subsystem 10 pins 24 or ancillary support inputs 32. The test station 10, by design, enables simultaneous and parallel testing (capture/analysis) of the plurality of signal nodes within the UUT 8. This analysis is as described above to ascertain whether one of the received signal inputs are indicative of a fault within the UUT 8.

Since the physical interface 6 may be custom tailored, it can be provided with interface components to enable it to interface with a shop replaceable unit (SRU) and a line replaceable unit (LRU) which comprises a plurality of smaller scale SRUs. Such interface components are known to those skilled in the art to which this invention pertains, as well as what is constituted by an SRU and an LRU.

As used herein, the controller 12 is an example of a processor, processing unit or processing system. These terms connote electrical hardware and associated software that enable the hardware to perform functions including but not limited to computational, communications, data management, data storage functions. One skilled in the art would readily understand what the physical components of such a unit are in view of the disclosure herein.

Among other functions performed by the controller 12, it can perform simultaneous processing of tests. To this end, the controller 12 can be configured to cause a waveform generating subsystem channel 20, digital subsystem 10 pin 24, DC power channel 28 or ancillary support component channels 32 to simultaneously provide stimulus signals to the UUT 8 when coupled to the test station via the physical interface 6. The controller 12 can also monitor analog/digital/RF/ancillary signal inputs from the UUT 8 using the digitizing instrumentation channels 16, digital subsystem 10 pins 24 or ancillary support inputs 32 which pass through the physical interface 6. The controller 12 then analyzes, simultaneously, each of the received input signals relative to pre-obtained input signals associated with the UUT 8 and which reflect the presence of a known fault in the UUT 8 to determine the pre-obtained input signals which is a closest match to the received input signal. Upon determining which of the received input signals is a closest match to each pre-obtained input signal, the controller 12 retrieves the identity of the known fault associated with the closest matching pre-obtained input signal, e.g., from a memory component within or associated with the controller 12. The controller 12 then outputs the identity of the detected fault via the user interface 36.

Controller 12 is also capable of sequential processing in which the controller 12 is configured to cause the various stimulus subsystems 18, 22, 26, 30 to sequentially provide stimulus signals to the UUT 8 when coupled to the test station 10 via the physical interface 6, and monitor reception of input signals by the various sampling subsystems 14, 22, 30 and the physical interface 6. Controller 12 also analyzes each received input signal relative to pre-obtained input signals associated with the UUT 8 and which reflect the presence of a known fault in the UUT 8 to determine which pre-obtained input signal is a closest match to the received input signal. Upon determining which received input signal is a closest match to the pre-obtained input signals, the controller 12 retrieves the identity of the known fault associated with the closest matching pre-obtained input signal, e.g., from a memory component within or associated with the controller 12. As before, the user interface 36 conveys the identity of the known fault(s) to the operator.

A typical scenario for use of all of the embodiments of the mixed signal testing system disclosed above is where the tester handles both stimulus and response signals. However, this is not required. It is contemplated that the invention also encompasses a mixed signal testing system wherein the tester could be used only for response (i.e., monitoring) whereby the stimulus is supplied by another source, e.g., an external source, or self-sourced by the UUT such as a BIT (built-in-test) capability. The mixed signal testing system would then only handle the processing of responsive signals in any of the ways described above.

An even more specialized mixed signal testing system is where the tester is stimulus only and the UUT has the means for receiving and providing status results from the stimulus signals (i.e., a visual indicator). The mixed signal testing system would thus only handle the generation of the stimulus signals and the manner in which evaluations are performed, as described above. Accordingly, it is not required that a mixed signal testing system in accordance with the invention include structure and processing functionality to enable stimulus signals to be generated and also structure and processing functionality to provide signals from a UUT received in response to the so-generated stimulus signals, and indeed, either of these structures and processing functionalities can be provided without the other, although the most likely use of the mixed signal testing system in accordance with the invention is including both structures and processing functionalities.

With respect to the formation of the TPS used in the mixed signal testing system, a TPS providing fault diagnostics would be used in most embodiments. However, as noted above, sometimes the mixed signal testing system is not used for both stimulus signal generation and directing to the UUT and receiving signal processing, but only for one of these functions. It is therefore possible to generate a response only TPS, or a stimulus only TPS. Moreover, it is possible to generate a screening TPS which has no diagnostics. This type of TPS is not as common for use as a TPS involving fault diagnostics but would be more common than a response only TPS and likely more common than a stimulus only TPS.

In the context of this document, computer-readable medium or media could be any means that can contain, store, communicate, propagate or transmit a program for use by or in connection with the method or arrangement disclosed above. The computer-readable medium can be, but is not limited to (not an exhaustive list), electronic, magnetic, optical, electromagnetic, infrared, or semi-conductor propagation medium. The medium can also be (not an exhaustive list) an electrical connection having one or more wires, a portable computer diskette, a random access memory (RAM), a read-only memory (ROM), an erasable, programmable, read-only memory (EPROM or Flash memory), an optical fiber, and a portable compact disk read-only memory (CD-ROM). The medium can also be paper or other suitable medium upon which a program is printed, as the program can be electronically captured, via for example, optical scanning of the paper or other medium, then compiled, interpreted, or otherwise processed in a suitable manner, if necessary, and then stored in a computer memory. Also, a computer program or data may be transferred to another computer-readable medium by any suitable process such as by scanning the computer-readable medium.

Computer software is also considered part of the invention and various programs are disclosed above. One program is configured to be executed by a processor to test a UUT by selecting one or more test files based on characteristics of the UUT being tested, retrieving the selected test file(s) from at least one computer readable memory medium storage, causing the processor to perform testing of the UUT being tested by using data in the retrieved selected test file(s), and generating a report of the testing by the processing unit of the UUT being tested. The same computer program or a different computer program is also configured to generate each test file to include at least one file containing data about a golden waveform, stimulus/acquisition configuration files associated with the golden waveform, at least one rules (bounds) files and at least one status message or component callout. The test files are stored in the computer readable memory medium storage and constitute an automated waveform analysis dictionary.

The computer program may also be configured to evaluate each generated rules file to determine uniqueness of the rules file, and when such evaluation determines that one of the generated rules files is not unique and thus the same as another of the generated rules files, merge the same generated rules files into a single rules file.

Another program is configured to be executed by a processor to conduct tests of at least one type of UUT using a mixed signal test station by creating a plurality of evaluations for testing the type of UUT when each UUT is coupled to the mixed signal test station based on signal analysis involving a fully functional (virtual or physical) UUT of that type, creating an initial sequence in which the evaluations are performed on a first article of the type of UUT being tested when coupled to the mixed signal test station, and performing the evaluations on the UUT being tested in accordance with the initial sequence using the mixed signal test station. This latter step entails monitoring reception of signals via a first plurality of channels that are generated in response to stimulus signals, analyzing, using a processor, each of the received signals relative to pre-obtained signals associated with the at least one UUT and which reflect the presence of a known fault in the at least one UUT to determine which pre-obtained signal is a closest match to the received signal, and upon determining which pre-obtained signal is a closest match to each received signal, retrieving the identity of the known fault associated with the closest matching pre-obtained signal, and outputting via a user interface, the identity of the known fault and a possible corrective action to take or an indication that no fault is present in the UUT. Optionally, the stimulus signals are provided using a signal generating subsystem via a second plurality of channels.

Yet another computer program is configured to be executed by a processor to conduct tests of at least one type of UUT by creating a plurality of evaluations for testing the type of UUT when each UUT is coupled to the mixed signal test station based on signal analysis involving a fully functional UUT of that type, creating an initial sequence in which the evaluations are performed on a first article of the type of UUT being tested when coupled to the mixed signal test station, and then performing the evaluations on the UUT being tested in accordance with the initial sequence using the mixed signal test station, at least some of the evaluations resulting in detection of a known fault with the UUT. Further, the computer program revises the initial sequence of evaluations to form a revised sequence of evaluations based on frequency that each evaluation results in detection of a known fault such that evaluations that more frequently result in detection of a known fault are ordered in the revised sequence of evaluations before evaluations that less frequently result in detection of a known fault, and then performs the evaluations on another UUT being tested in accordance with the revised sequence using the mixed signal test station.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and is not limiting. The invention is limited only as defined in the claims and equivalents thereto.

The invention claimed is:

1. A method for testing at least one unit under test (UUT) for the presence of faults via analysis of waveforms output from the UUT, the UUT having multiple input channels and multiple output channels, comprising:
   applying stimulus signals to the UUT from at least one stimulus signal source coupled to the UUT and via the input channels;
   acquiring a set of waveforms output from the UUT via the output channels in response to application of the stimulus signals to the UUT from the at least one stimulus signal source, the acquired set of waveforms including a plurality of waveforms;
   retrieving, using a processor, a plurality of rules files stored in a memory component, each of the rules files containing a plurality of rules and having a representation of being associated with a waveform that is known to be a good waveform without faults or being associated with a specific fault in a waveform;
   for each retrieved rules file, aligning, using the processor, each of the plurality of waveforms in the acquired set of waveforms to a selected one of a plurality of rules in the retrieved rules file;

calculating, using the processor, a similarity score for the acquired set of waveforms relative to the selected one of the plurality of rules in the retrieved rules file indicative of a degree of matching between the acquired set of waveforms and the plurality of rules in the retrieved rules file;

storing, in a memory component, the calculated score in association with the retrieved rules files; and thereafter conveying using a conveyance device, a list of the representation of at least part of the retrieved rules files in an order based on the calculated scores.

2. The method of claim 1, wherein the step of applying stimulus signals to the UUT from the stimulus signal source coupled to the UUT comprises simultaneously directing mixed signals (parallel analog and digital signals) to the UUT.

3. The method of claim 1, further comprising initiating the application of the stimulus signals to the UUT only when a response to an initiation prompt requiring a response is detected.

4. The method of claim 1, wherein the plurality of waveforms of the acquired set of waveforms are acquired in parallel or singularly, and the step of calculating, using the processor, the similarity score for the acquired set of waveforms relative to the selected one of the plurality of rules in the retrieved rules file comprises summing the scores of each waveform in the set.

5. The method of claim 1, wherein the acquired set of waveforms comprises a set of a plurality of analog signals, a set of a plurality of digital signals or a set including at least one analog signal and at least one digital signal.

6. The method of claim 1, wherein the conveyance device is a display, further comprising displaying on the display, the list of retrieved rules files in the order based on the calculated scores.

7. The method of claim 1, further comprising determining the order by considering a minimum score to be when the acquired set of waveforms is in exact accordance with the plurality of rules in the retrieved rules file and a maximum score to be when the acquired set of waveforms is not in accordance with the plurality of rules in the retrieved rules file.

8. The method of claim 7, further comprising sorting the calculated scores using the processor before conveying the list of the retrieved rules files in the order based on the calculated scores.

9. The method of claim 1, wherein the step of conveying, using the conveyance device, a list of the representation of at least part of the retrieved rules files in an order based on the calculated scores comprises conveying only a single rules file when the best retrieved rules file is associated with a representation that it is a waveform that is known to be a good waveform without faults.

10. The method of claim 1, wherein the step of conveying, using the conveyance device, a list of the representation of at least part of the retrieved rules files in an order based on the calculated scores comprises conveying a limited number of the rules files when none of the retrieved rules files is associated with a representation that it is a waveform that is known to be a good waveform without faults.

11. A method for conducting tests of at least one type of unit under test (UUT) using a mixed signal test station, the UUT having multiple input channels and multiple output channels, comprising:

creating a plurality of evaluations for testing the type of UUT when each UUT is coupled to the mixed signal test station based on signal analysis involving a fully functional UUT of that type;

creating an initial sequence of evaluations selected from the created plurality of evaluations in which the evaluations are performed on a first article of the type of UUT being tested when coupled to the mixed signal test station;

performing each of the evaluations on the UUT being tested in accordance with the initial sequence using the mixed signal test station, the step of performing each evaluation comprising receiving, using a signal receiving system and via the output channels, a plurality of waveforms that are generated by the UUT being tested in response to stimulus signals provided to the UUT via the input channels;

analyzing, using a processor, each of the received waveforms relative to pre-obtained waveforms associated with the at least one UUT and which reflect the presence of a known fault in the at least one UUT to determine which pre-obtained waveform is a closest match to the received waveform, and upon determining which pre-obtained waveform is a closest match to each received waveform, retrieving the identity of the known fault associated with the closest matching pre-obtained waveform; and outputting via a user interface, the identity of the known fault and a possible corrective action to take or an indication that no fault is present in the UUT.

12. The method of claim 11, wherein the step of performing each evaluation further comprises providing, using a signal generating system, the stimulus signals to the UUT being tested via the input channels.

13. The method of claim 11, further comprising:

revising the initial sequence of evaluations to form a revised sequence of evaluations based on frequency that each evaluation results in detection of a known fault such that evaluations that more frequently result in detection of a known fault are ordered in the revised sequence of evaluations before evaluations that less frequently result in detection of a known fault; and then performing each of the evaluations on another UUT being tested in accordance with the revised sequence using the mixed signal test station.

14. The method of claim 13, further comprising:

maintaining an evaluation sequence file on computer-readable memory storage medium containing the initial sequence of evaluations; and modifying the evaluation sequence file when the initial sequence of evaluations is revised to the revised sequence of evaluations such that the evaluation sequence file reflects the revised sequence of evaluations.

15. The method of claim 13, further comprising:

revising the revised sequence of evaluations to a further revised sequence of evaluations based on frequency that each evaluation results in detection of a known fault such that evaluations that more frequently result in detection of a known fault are present in the further revised sequence of evaluations before evaluations that less frequently result in detection of a known fault.

16. A method for conducting tests of at least one type of unit under test (UUT) using a mixed signal test station, comprising:

creating a plurality of evaluations for testing the type of UUT when each UUT is coupled to the mixed signal test station based on signal analysis involving a fully functional UUT of that type;

creating an initial sequence of evaluations selected from the created plurality of evaluations in which the evaluations are performed on a first article of the type of UUT being tested when coupled to the mixed signal test station;

performing each of the evaluations on the UUT being tested in accordance with the initial sequence of evaluations using the mixed signal test station, at least some of the evaluations resulting in detection of a known fault with the UUT;

revising the initial sequence of evaluations to form a revised sequence of evaluations based on frequency that each evaluation results in detection of a known fault such that evaluations that more frequently result in detection of a known fault are ordered in the revised sequence of evaluations before evaluations that less frequently result in detection of a known fault; and then performing each of the evaluations on another UUT being tested in accordance with the revised sequence of evaluations using the mixed signal test station.

17. The method of claim 16, wherein the step of performing each of the evaluations comprises:

providing, using a signal generating system, the stimulus signals to the UUT being tested via channels;

receiving signals, using a signal receiving system, that are generated by the UUT being tested in response to the stimulus signals; and analyzing, using a processor, each received signal relative to pre-obtained signals associated with the type of UUT and which reflect the presence of a known fault in the type of UUT to determine which pre-obtained signal is a closest match to the received signal, and upon determining which pre-obtained signal is a closest match to each received signal, retrieving the identity of the known fault associated with the closest matching pre-obtained signal.

18. A mixed signal testing system for testing a unit under test (UUT), the UUT having multiple input channels and multiple output channels, comprising:

an instrumentation that receives a plurality of waveforms from the UUT via the output channels in response to stimulus signals provided to the UUT via the input channels;

a processor that analyzes each of the received waveforms relative to pre-obtained waveforms from a fully functional UUT of the same type as the UUT being tested after being provided with the same stimulus signals, the pre-obtained waveforms including pre-obtained waveforms which reflect the presence of a known fault in the UUT, said processor determining, based on the analysis, the pre-obtained waveforms which is a closest match to the received waveform, and upon determining the pre-obtained waveforms which is a closest match to each received waveform, retrieving the identity of the known fault associated with the closest matching pre-obtained waveform; and at least one user interface coupled to said processor and that outputs the identity of one or more known faults, said processor being configured to generate an indication to output via said user interface when a failing waveform is detected but none of the pre-obtained waveforms are determined to be a closest match to the received waveform, a failing waveform being a waveform received as one of the received waveforms and that deviates from a waveform expected in response to the associated stimulus waveform.

19. The mixed signal testing system of claim 18, further comprising a signal generating system that provides the stimulus signals to the UUT via the input channels.

20. The mixed signal testing system of claim 18, wherein the indication is a default callout representing non-detectable callouts.

21. The mixed signal testing system of claim 18, wherein said processor is configured to select one of a plurality of different indications to output via said at least one user interface based on a combination of failing waveforms.

22. The mixed signal testing system of claim 18, wherein the known faults in the UUT are stored in a fault dictionary embodied in computer-readable memory storage medium, said processor being configured to enable said fault dictionary to be changed via a user using said at least one user interface based on a number of appearances of each generated indication such that the user can add a known fault to the fault dictionary after the known fault has manifested itself in generation of failing waveforms.

23. The mixed signal testing system of claim 18, wherein the indication is a flagged, conditional callout message, said processor being configured to, based on user input via said at least one user interface, associate a state to the indication, the state being one of proper causing removal of the flagged condition, maintain the indication as a flagged, conditional callout message and a different callout for the failing condition.

24. The mixed signal testing system of claim 23, wherein the known faults in the UUT are stored in a fault dictionary embodied in computer-readable memory storage medium and said processor is further configured to:

count a number of times that the same indication is generated without having its associated state changed to proper, and after the number of times exceeds a predetermined number, associate a state to the indication of permanent callout status causing removal of the flagged condition and addition of the indication to the fault dictionary.

* * * * *